(12) United States Patent
Johnson et al.

(10) Patent No.: US 7,184,556 B1
(45) Date of Patent: Feb. 27, 2007

(54) COMPENSATION SYSTEM AND METHOD FOR SOUND REPRODUCTION

(75) Inventors: Keith O. Johnson, Pacifica, CA (US);
Alex Limberis, Bellevue, WA (US);
Mats Myrberg, Seattle, WA (US);
Timothy E. Onders, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 1018 days.

(21) Appl. No.: 09/637,821

(22) Filed: Aug. 11, 2000

Related U.S. Application Data

(60) Provisional application No. 60/148,412, filed on Aug. 11, 1999.

(51) Int. Cl.
*H03G 3/00* (2006.01)
*H04R 29/00* (2006.01)

(52) U.S. Cl. .......................... 381/61; 381/59
(58) Field of Classification Search ............... 381/61, 381/97, 98, 103, 119, 59, 94.9
See application file for complete search history.

(56) References Cited

U.S. PATENT DOCUMENTS

| | | | |
|---|---|---|---|
| 4,223,181 A * | 9/1980 | Simeau ..................... 381/98 |
| 4,612,665 A | 9/1986 | Inami et al. |
| 5,054,077 A | 10/1991 | Suzuki |
| 5,168,251 A | 12/1992 | Zennamo, Jr. et al. |
| 5,305,388 A * | 4/1994 | Konno ...................... 381/102 |
| 5,438,625 A * | 8/1995 | Klippel ...................... 381/96 |
| 5,524,060 A | 6/1996 | Silfvast et al. |
| 5,533,120 A | 7/1996 | Staudacher |
| 5,588,065 A * | 12/1996 | Tanaka et al. ................ 381/96 |
| 5,694,476 A * | 12/1997 | Klippel ..................... 381/96 |
| 5,815,580 A * | 9/1998 | Craven et al. ................ 381/58 |
| 5,815,585 A * | 9/1998 | Klippel ..................... 381/96 |
| 5,953,431 A * | 9/1999 | Yashima et al. ............ 381/103 |

(Continued)

FOREIGN PATENT DOCUMENTS

| | | |
|---|---|---|
| EP | 0 122 663 | 5/1984 |
| EP | 0122663 | 10/1984 |
| GB | 2 310 104 A | 8/1997 |
| GB | 2310104 | 8/1997 |

OTHER PUBLICATIONS

Raczynski, Bohdan, "Active Equalization Of Loudspeakers" Speaker Builder, Feb. 1997, pp. 8-12.

(Continued)

*Primary Examiner*—Xu Mei
(74) *Attorney, Agent, or Firm*—Lee & Hayes, PLLC

(57) ABSTRACT

A sound compensation system alters an electrical audio signal for input to a sonic reproduction device having associated behavioral characteristics. The behavior characteristics of the device are defined by individual or groups of individual components of the sonic reproduction device and include mechanical, acoustic and electromagnetic behaviors. The model includes a plurality of filters that simulate at least one of the behavior characteristics of the sonic reproduction device. The filters are defined by digital signal processes or by analog circuits and are characterized by one or more of an associated frequency, time, phase and transient response. These responses combine to define an overall response for the model. The filters include adjustable parameters which are used to alter filter responses to produce responses that are conjugates to the responses of the unaltered filters and thus the sonic reproduction device. A controller modifies the parameters.

9 Claims, 15 Drawing Sheets

U.S. PATENT DOCUMENTS

| | | |
|---|---|---|
| 6,252,968 B1 * | 6/2001 | Narasimhan et al. ....... 381/103 |
| 6,295,364 B1 * | 9/2001 | Finn et al. .................. 381/110 |
| 6,317,117 B1 * | 11/2001 | Goff .......................... 345/156 |
| 6,721,428 B1 | 4/2004 | Allred et al. |
| 2003/0132956 A1 | 7/2003 | Duncan |

OTHER PUBLICATIONS

Mendonsa, Ruth A., "Laser Vibrometer Heightens Speaker Design" Photonics Spectra, Jan. 1998, p. 18.

Toole, Floyd E. and Olive, Sean E., "The Modification of Timbre by Resonances: Perception and Measurement" J. Audio Eng. Soc., vol. 36, No. 3, Mar. 1988, pp. 122-123.

Fasoldt, A., Jul./Aug. 1999 column in Fanfare Magazine, pp. 383-384.

Herschelmann, Russ, "Home Theater Architect—Is It Golden or Goofy?" Stereophile Guide to Home Theater Nov. 1998, pp. 42-44.

* cited by examiner

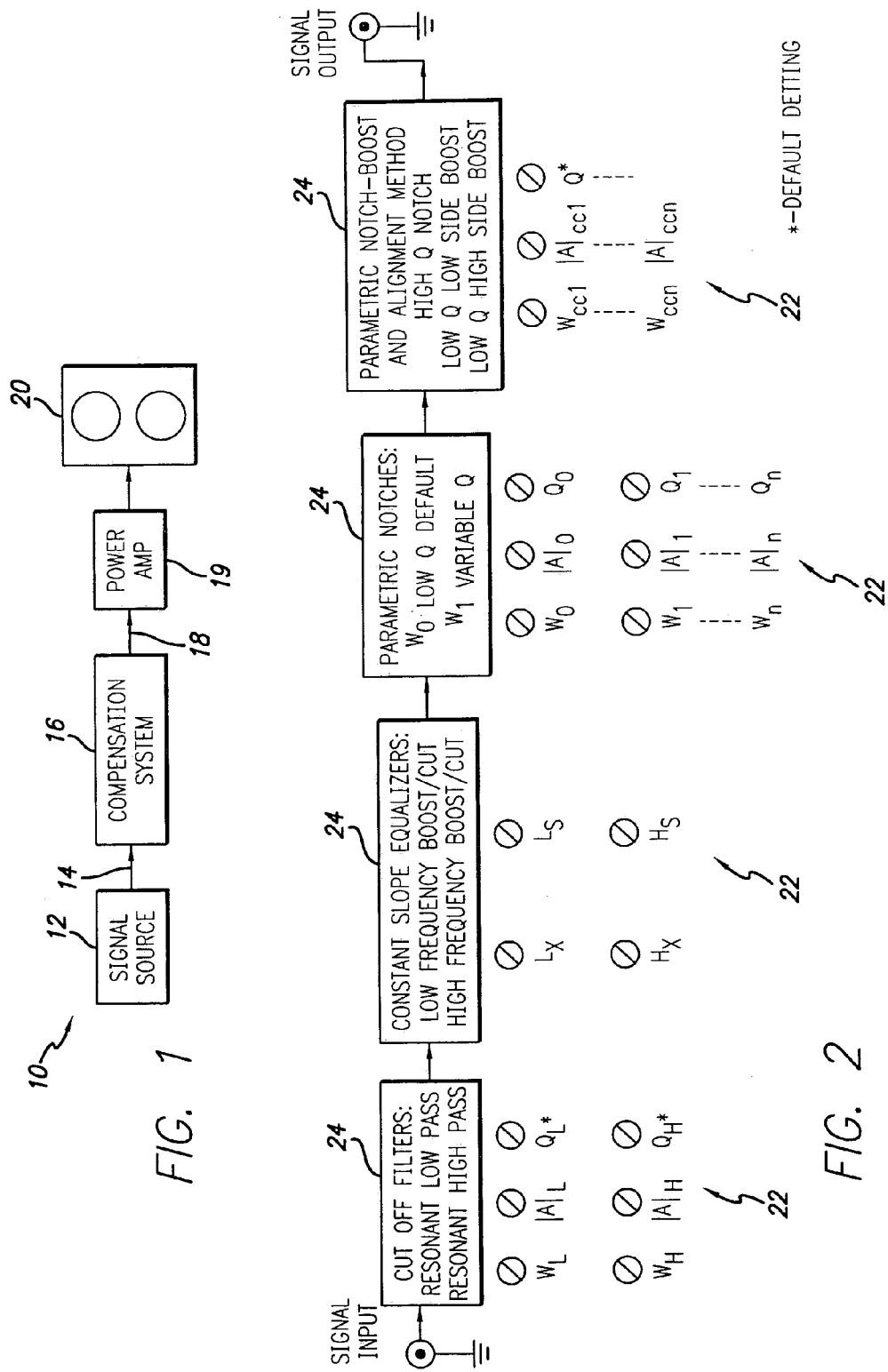

FIG. 3a ELECTRO MECHANICAL BEHAVIOR
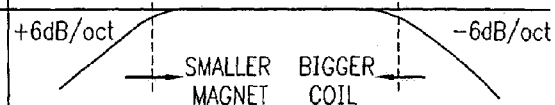
FIG. 3b ACOUSTO MECHANICAL BEHAVIOR
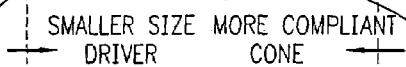
FIG. 3c COUPLING BEHAVIOR
FIG. 3d COMPLIANCE-AIR VOLUME RESONANCE AND MECHANICAL RESONANCE
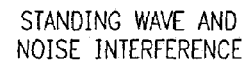
FIG. 3e WAVE RELATED MECHANICAL BEHAVIOR
FIG. 3f OVERALL RESPONSE IN ENCLOSURE
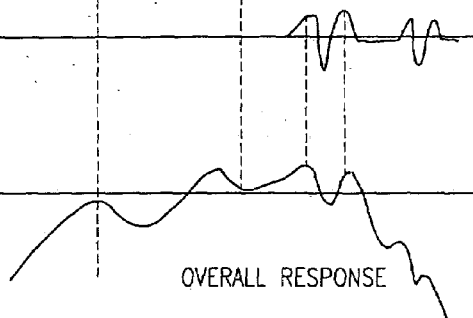

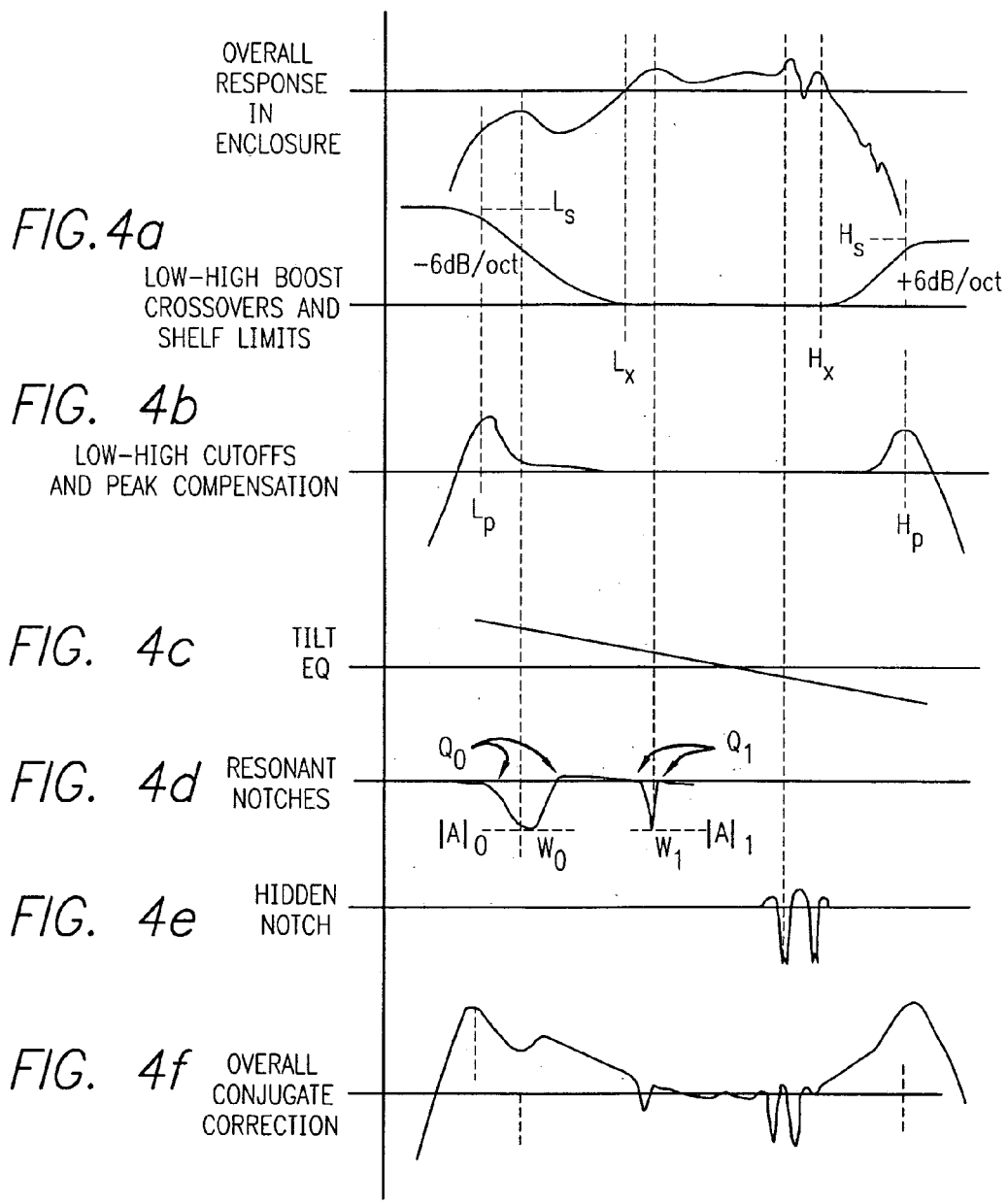

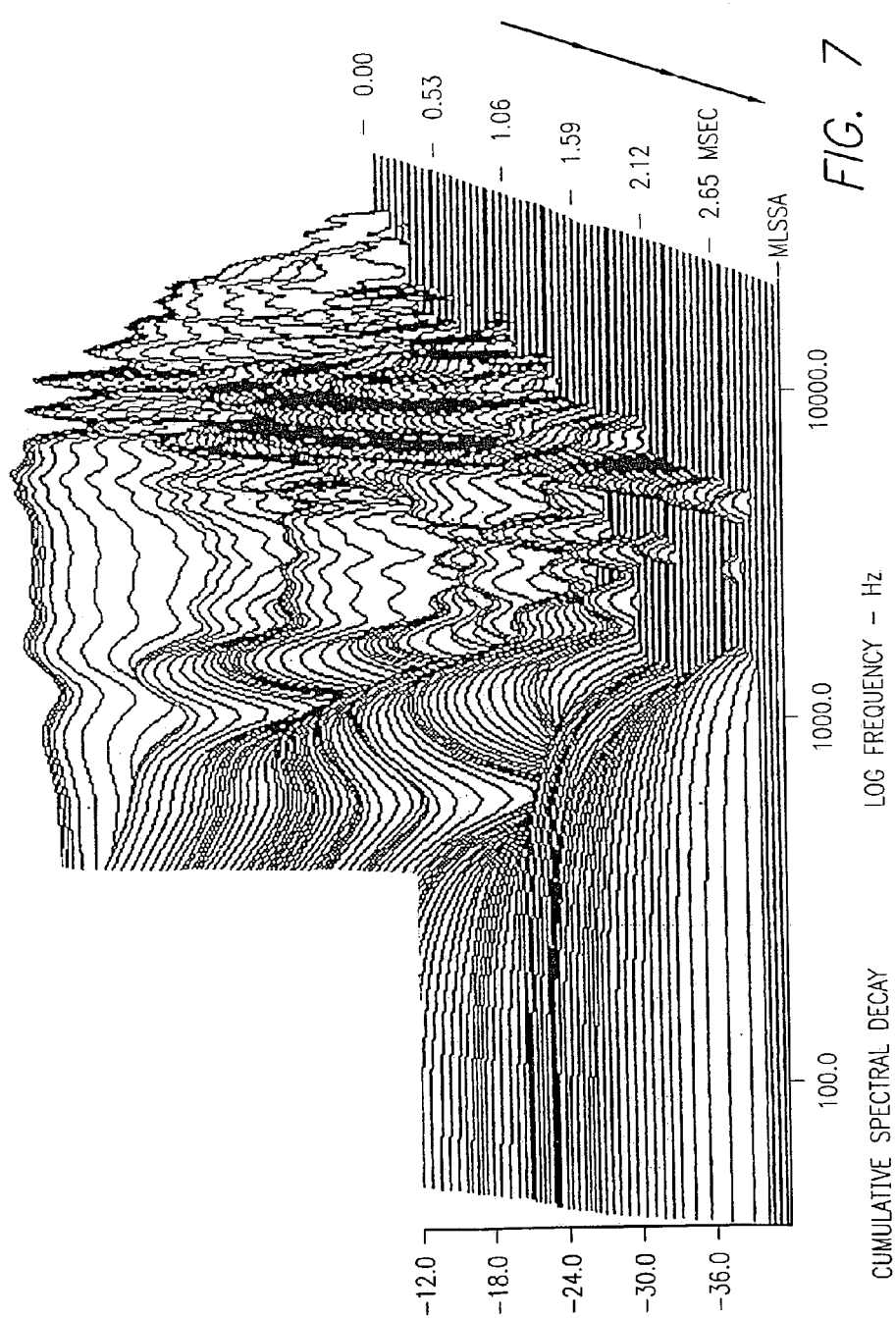

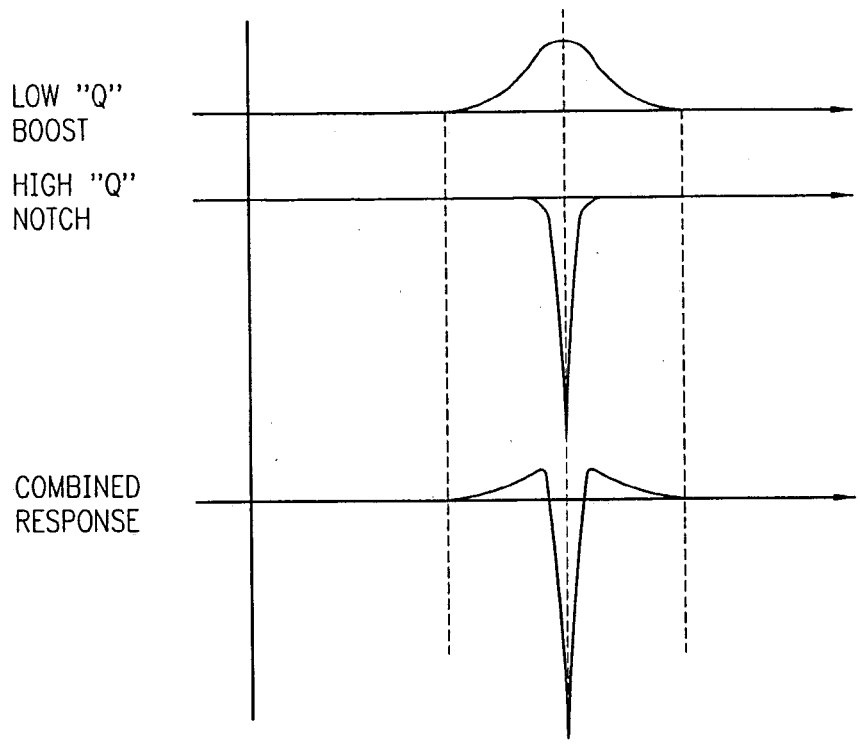
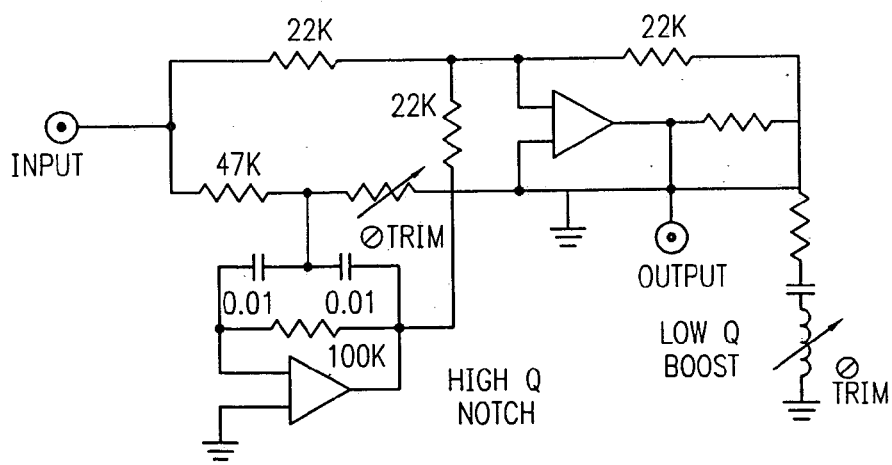
FIG. 13

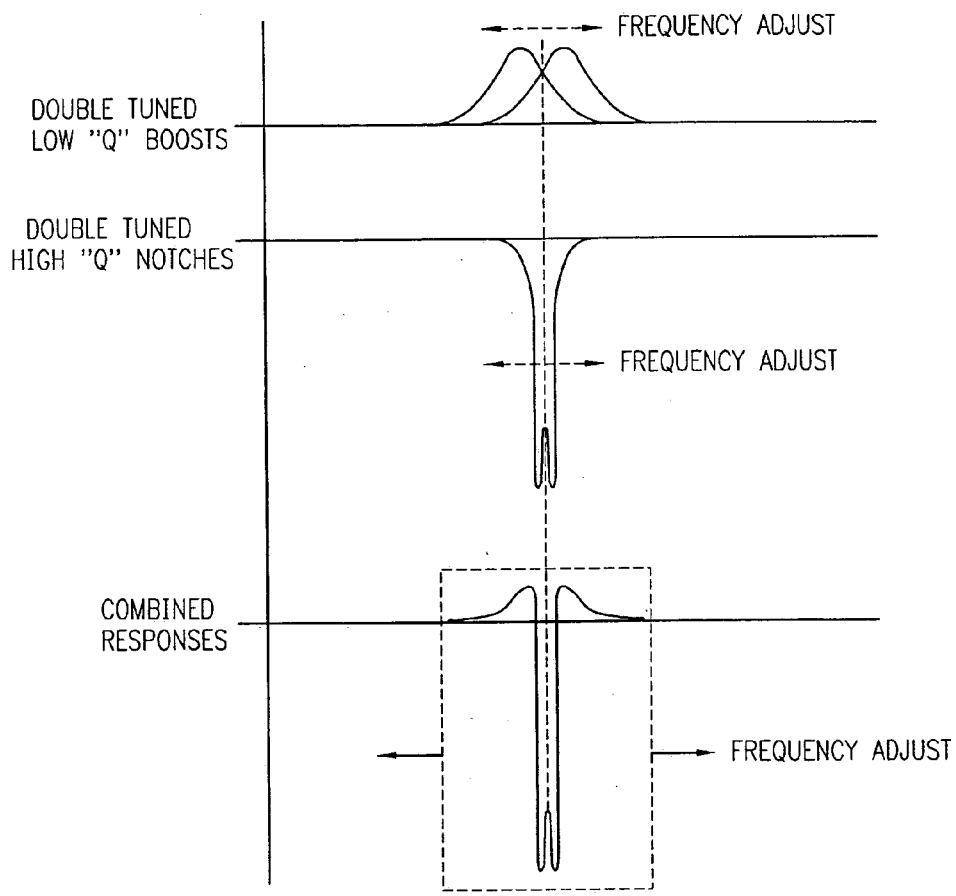
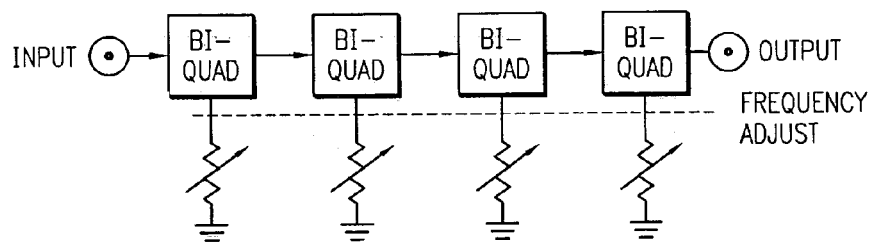
FIG. 14

COMPENSATION SYSTEM AND METHOD FOR SOUND REPRODUCTION

RELATED APPLICATION

This application claims the benefit of co-pending provisional application Ser. No. 60/148,412 filed Aug. 11, 1999.

BACKGROUND OF THE INVENTION

1. Field of the Invention

This invention relates generally to a compensation method and system for use in sonic transmission and reproduction systems and more particularly to a compensation method and system that uses parametric values to control or adjust processes having transforms or models with properties or responses like the components or elements used in the transmission or reproduction system.

2. Description of Related Art

Most audio reproduction systems use electromechanical loudspeakers to acoustically reproduce audio signals. The electrical, mechanical, and acoustical properties of the loudspeakers are often less than ideal, causing distortions, response anomalies, and other coloration of the sound. Many techniques are used to compensate for the loudspeaker's characteristics in order to improve perceived audio quality.

Functional or behavioral models of loudspeakers are used in practice and found in literature to develop such compensations. A good example of models and how the modeling process works is described in "Active Equalization of Loudspeakers", Speaker Builder, February 1997. Models consolidate technical languages and are usually intended to imitate or simulate the acoustic responses of the speaker system from electrical stimulus. Model creation or synthesis frequently begins by making functional groupings of elements which collectively represent or behave like all or part of the speaker. Coil and magnet parts become motors, which are represented by resistors, inductors, capacitors, back EMF generators and other transformed parts. A combination of factors such as air volume, moving mass, acoustic loading, magnetic-braking, and mechanical losses might be analyzed and simplified to LCR resonator networks or circuits. Most often, the transformed electromechanical, acoustic, and mechanical representations expressed in the model are further simplified or reduced to fewer elements. The model still responds like the speaker, but the parts making the model no longer have exact behavioral equivalence to the parts making the speaker. Consequently, traditional models are neither intended, nor capable of making parametrically addressed zero-phase compensations when speaker parts are changed.

One could characterize and invert the frequency response, as well as other properties, of a well-conceived model and achieve linear-phase correction of the loudspeaker. The technique does work to a fashion, but its dedicated, inflexible circuitry or specialized process tied to the traditional model limits its use to a one-speaker design. Some high-quality crossover networks constructed to divide the signal spectrum amongst multiple drivers may have some conjugate response correction like this.

A low-frequency resonant boost is intentionally designed for most speakers. Frequently, traditional models are made to represent quantifiable and predictable acoustic behavior as well as other speaker design factors affecting bass response. Mechanical construction and properties of air determine frequency, resonant losses and the configuration's effect on acoustic output from the speaker. A good approximation to a zero-phase conjugate or same-order correction for a wider frequency range can be designed and implemented in this manner. Several components are needed to match the resonant behavior, but all interact with each other when adjustments are made for a different speaker of similar concept and design. Therefore, the operation is not strictly parametrically controlled, as the adjustments must be re-calculated from the model to create the minimum-phase or exact match needed for best fidelity with the new speaker. When more corrections are added the interaction problem becomes formidable. The system must be tuned experimentally or the model analyzed each time an adjustment is made. Consequently, lumped model processes for response flattening are inherently designed for a specific speaker. The process must be redesigned for other speakers.

Traditional curve-fitting methods can require hundreds of data points and corresponding adjustments to set up and many components or much processing power to match the acquired frequency response. Analog methods are impractical and digital processes require much computation and extensive architectures to do this. Neither can provide phase accurate responses or the hidden corrections described later without having knowledge of the speaker and its operation. Without a model, the effort to combine amplitude, time and phase corrections together from measured responses becomes formidable.

Some of the most important behaviors of loudspeakers (with respect to acoustically perceptible effect) cannot be modeled or implemented from traditional methods. Such behaviors include standing wave interference, modal breakup, and coupled resonance as well as nonlinear consequences from such potentially interacting acoustic and mechanical behaviors. Counterproductive random motion or breakup may occur. Even when the average response remains flat or is the same as other frequencies being reproduced, energy can build up during signal stimulus and be released when the signal changes or ceases. In addition, other spatial factors related to stiffness of moving parts and high frequency de-coupling for motions away from a driving voice coil need to be considered. Any of these can create source movements, delayed energy release, and phase error to binaural hearing. Often, such destructive responses can be invisible or very difficult to interpret from traditional microphone-and-spectrum-analyzer calibration methods.

For example, unwanted responses arising from nodal and standing wave behavior affect the settling time, directional behavior, and radiated output of a speaker. Frequently, these responses cause perceptual changes to intelligence signals yet may not be visible or recognizable from response plots. Mechanical motions having large stored energy can be out of phase at different parts of the transducer. The acoustic output might appear to be flat, but human binaural hearing can localize the behavior to its source and the altered perception can degrade stereo imaging.

Often, mechanical disturbances are audible yet invisible or hard to interpret from response measurements made using a frequency sweep and microphone. Parts of a radiating surface can vibrate with different phase relationships to other parts, so that their additive acoustic output is low compared to motions within the transducer and the energy storage involved. When signals at the node frequency change and suddenly stop the release of stored energy can interact with other signals at different frequencies. The resulting beat sounds between the two frequencies can be audible and very objectionable. Sounds with spectra in the interference frequency range may appear louder and granular. Human binaural hearing can localize the disturbance to the driver or surfaces from which directional lobes might bounce, thereby imparting further damage to the stage illusion from multi-speaker stereo reproduction. For this situation, frequencies creating the mechanical disturbance must be sufficiently attenuated to prevent unmasked reproduction of consequential responses. Experience has shown that a sharp, deep notch needed to do this removes enough energy around the correction frequencies to cause a nasal sound. If this inappropriate correction is modified to achieve flat response, then the mechanical sounds remain along with a potential undesirable balance aberration.

Many small loudspeakers are constructed with a transducer, enclosure, and some resonant means to extend bass response such as a port or passive radiator. Usually, these parts are designed to achieve a practical and economical compromise between efficiency, frequency response accuracy, bass extension, and acceptable distortion. Designers of inexpensive, low-powered systems generally opt for higher efficiency to reduce amplifier requirements along with related costs of power supplies and packaging. The compromise situation exposes many undesirable behavioral aspects.

Most traditional speaker correction methods apply some variation of amplitude equalization to flatten and extend response from speakers. Adjustments are sometimes done by ear. To be quantitative, one must acquire relevant data. The most common techniques to do this use spectral analysis from noise stimulus. Then, response plots or displays indicate how an equalizer is to be adjusted. More sophisticated techniques based on delayed acceptance or sampled windows can measure first-arrival responses from the speaker and remove higher-frequency room disturbance to create anechoic-like data. The intent is to capture information relevant either to a listener in a room or to standard measurement practice where a test microphone is usually specified and placed one meter from the speaker. Such technique creates a response that may sound balanced to the single-point test microphone. One or more known systems go slightly beyond this by adjusting path lengths, or time delays to align multiple speakers to a listening position.

Other techniques provide transient response waveforms, waterfall or successions of spectral plots after an event. Group delay and time-related information is acquired. Such data needs interpretation and has limited use for frequency response leveling practice. Some behavioral responses can be recognized but much more information must be known about the speaker. Measurement devices such as accelerometers, differential acoustic probes, as well as microphones, are needed for this. Instrumentation may be placed near a suspected behavior site and moved to explore how a response changes with position. Weighted notches can be tuned or slowly swept through suspected frequencies while subjectively observing noise production. More information is needed about dimensions of parts, listening positions, as well as floor, shelf, possibly a computer monitor, or other interceding objects that may be part of the listening environment. Other technical specifications or expressions are needed to complete the conjugate model capable of time-phase-accurate correction.

A human operator can assume an alignment role by adjusting a graphic equalizer, manually tuning a parametric filter, or changing settings to a crossover device. Commercial analog components perform these functions, but they have limitations. Graphic equalizers have up to 31 bands or resonators, parametric devices include several adjustable filters and a few have variable crossover and shelf functions. Many more filters are needed. Combinations of graphic and parametric equalizers are incapable of providing a large enough number of points, nor the exact phase and time response to effectively compensate complex behavior from a loudspeaker. Either the corrections do not match specific frequencies, thereby creating phase error, or the number of filters is inadequate to deal with settling time and standing wave issues. Group delay distortion, time-phase error, incomplete correction and other shortcomings are likely to outweigh other improvements.

DSP filters can create many more filter sections than is practical from analog circuits. Graphic equalizers made up with parametrically controlled sections have been used with specialized control-generating software to create room response leveling. Such processes are difficult to set up because the room interferes with the identification of important behavioral indicators. Without their input, conjugate response corrections are not possible. Standing-wave and nodal distortion corrections could be made from such a system. However, the awkward compiling and processing needed to parametrically move the compensated notches would be difficult. Most likely, a single point response pickup and FFT has been used for data input to the system. Such methods cannot respond to or provide the time-phase information needed to create a true conjugate response to the speaker. Analysis systems, such as MLSSA, can remove room interference from measurements, and can produce frequency, transient, and settling response data from a loudspeaker system. However, the large amount of data from these measurements must be interpreted. The multiple-band graphic equalizer is not a good choice to install the correction.

DSP systems can economically create many parametric filters and time-related processes that are impractical with analog circuitry. Traditional large-scale DSP systems have little means to identify and cull out speaker behavior from other measurement anomalies. Their frequency-domain responses are likely to add phase errors and to overlook delayed settling energy. The sound might improve for one listening position but it will degrade for all others. More likely, the reproduced sound will change without definitive improvement.

Hence, those concerned with the reproduction of sound have recognized the need for a system and method of modeling the complete behavior of sound reproduction devices such that conjugate responses to the sound reproduction device responses may be created. The need for a system and method employing modifiable conjugate response has also been recognized. Furthermore, the need has also been recognized for a system and method that compensates the reproduction of sound independent of the environment in which the sound is to be heard. The present invention fulfills these needs and others.

SUMMARY OF THE INVENTION

Briefly, and in general terms, the present invention provides a system and method for modeling individual response characteristics of a sonic reproduction device to create a conjugate model for improving frequency, time, phase, and amplitude performance of the device and to provide improved sonic balance, sound clarity, reduced distortion and improved stereo imaging.

In a first aspect, the invention relates to an apparatus for modifying an electrical audio signal for input to a sonic reproduction device characterized by a plurality of individual responses. The individual responses of the device combine to define an overall response. Each individual response includes one or more of a frequency, time, phase or transient response. The apparatus includes a plurality of modification filters having modification responses that simulate the plurality of individual responses of the sonic reproduction device. The modification filters receive the electrical audio signal, modify the electrical audio signal and provide the electrical audio signal to the sonic reproduction device. The apparatus further includes a plurality of adjustable parameters. Each of the adjustable parameters is associated with at least one of the modification filters. The adjustable parameters allow for adjustments to the responses of the modification filters. The adjustments create a plurality of individual conjugate responses. Each individual conjugate response is associated with at least one of the plurality of individual responses.

By creating a plurality of filters or networks having responses that model the individual responses of the reproduction device and providing parameters for adjusting the filter or network responses, the system allows for the creation of conjugate responses that provide specific opposing or correction responses to the response of the reproduction device.

In a detailed aspect of the invention, the plurality of individual responses of the sonic reproduction device are related to at least one of mechanical, acoustic and electromagnetic behavior of the sonic reproduction device. In another detailed facet of the invention, the plurality of modification responses combine to form an overall response that is a conjugate to the overall response of the sonic reproduction device.

In yet another detailed aspect of the invention, at least one of the modification filters comprises a cut-off filter and the parameters for adjusting the frequency response of the cut-off filter include peak frequency, amplitude and Q parameters. In still another aspect of the invention, at least one of the modification filters comprises a constant slope equalizer and the parameters for adjusting the frequency response of the constant slope equalizer include crossover frequency and boost shelf parameters. In other detailed facets of the invention, at least one of the modification filters comprises a parametric notch filter and the parameters for adjusting the frequency response of the parametric notch filter include notch frequency, amplitude and Q parameters and at least one of the modification filters comprises a parametric notch-boost filter and the parameters for adjusting the frequency response of the parametric notch-boost-filter include notch frequency, amplitude and Q parameters.

In a second aspect, the invention relates to a sound compensation system for altering an electrical audio signal for input to a sonic reproduction device having associated behavioral characteristics. The system includes a model of the sonic reproduction device. The model includes a plurality of filters or processes that simulate at least one of the behavioral characteristics of the sonic reproduction device. Each filter has an associated response that combine to define an overall response for the model. Each individual response includes one or more of a frequency, time, phase or transient response. The system also includes a controller that modifies the response of each of the plurality of filters to transform the filter into a conjugate filter. Each conjugate filter has a response that is a conjugate to the original response of the filter or process.

In a detailed aspect of the invention, the behavioral characteristics are defined by individual or groups of individual components of the sonic reproduction device. By modeling the reproduction device's individual components and the characteristics of those components or groups of components, individual compensations for these characteristics can be created and manipulated parametrically. Therefore, these same compensations can be applied to additional systems having similar components or characteristics.

In other detailed aspects of the invention, the filters are defined by digital signal processes or by analog circuits and the controller includes a computer or adjustable circuit components. In other detailed aspects of the invention, the sonic reproduction device comprises a speaker and at least one of the plurality of filters includes at least one associated adjustable parameter and the value of the parameter is calculated based on physical characteristics of the speaker, derived from a standard speaker model or determined experimentally using standard test measurements. In yet another detailed aspect of the invention, the controller is configured such that an adjustment in the setting of one parameter modulates the setting of at least one other parameter. In still another detailed facet of the invention, the controller monitors the program conditions at the sonic reproduction device and sets at least one of the parameter values based on the program conditions.

In a third facet, the invention relates to a sound system. The sound system includes a sonic reproduction device having associated mechanical, acoustic and electromagnetic behavioral characteristics. The sound system also includes a source for outputting an electrical audio signal to a model of the sonic reproduction device. The model includes a plurality of filters that simulate at least one of the mechanical, acoustic and electromagnetic behavioral characteristics of the sonic reproduction device. Each filter has an associated response that includes at least one of a frequency, time, phase or transient response. The model outputs the electrical audio signal to the sonic reproduction device. The sound system further includes a controller that modifies the responses of the filters to transform the model into a conjugate model having a plurality of filters with responses that comprise conjugates to the original response of the filter.

In a fourth aspect, the invention relates to a method for modifying an electrical audio signal for input to a sonic reproduction device that is characterized by a plurality of individual responses which in combination define an overall frequency response for the sonic reproduction device. Each individual response includes one or more of a frequency, time, phase or transient response. The method includes the steps of simulating the plurality of individual responses with a plurality of filters and adjusting the responses of the plurality of filters such that, for each filter, the adjusted response comprises a response that is a conjugate to one of the individual responses. The method further includes the step of inputting the electrical audio signal to the filters.

In a detailed aspect of the invention, at least one of the filters comprises a cut-off filter and the step of adjusting the frequency response of the cut-off filter includes the step of setting at least one of peak frequency, amplitude and Q. In another detailed facet of the invention, at least one of the filters comprises a constant slope equalizer and the step of adjusting the frequency response of the constant slope equalizer includes the step of setting at least one of crossover frequency and boost shelf. In still another detailed aspect, at least one of the filters comprises a parametric notch filter and the step of adjusting the frequency response of the parametric notch filter comprises the step of setting at least one of notch frequency, amplitude and Q. In yet another detailed aspect of the invention, at least one of the filters comprises a parametric notch-boost filter and the step of adjusting the frequency response of the parametric notch-boost filter comprises the step of setting at least one of notch frequency, amplitude and Q.

In a fifth facet, the invention relates to a method of altering an electrical audio signal for input to a sonic reproduction device having associated behavioral characteristics. The method includes the step of simulating at least one of the behavioral characteristics of the sonic reproduction device with a plurality of filters. Each of the filters has an associated response comprising at least one of a frequency, time, phase or transient response. The method further includes the step of, for each of the filters, modifying the response of the filter to transform the filter into a conjugate filter having a response that comprises a conjugate to the original response of the filter.

In detailed facets of the invention, the sonic reproduction device comprises a speaker, at least one of the plurality of filters has at least one associated adjustable parameter and the step of modifying the response of the filter includes one or more of the following pairs of steps: calculating the value of the adjustable parameter value based on the physical characteristics of the speaker and setting the parameter to the calculated value, deriving the adjustable parameter from a standard speaker model and setting the parameter to the derived value and determining the adjustable parameter experimentally using standard test measurements; and setting the parameter to the determined value. In still another detailed facet of the invention, the method further includes the step of modulating the setting of at least one parameter in response to the setting of another parameter. In another detailed facet, the method further includes the steps of monitoring at least one program condition at the sonic reproduction device and setting at least one of the parameter values based on the program condition.

These features and the ability to maintain sonic neutrality make a compensation system and method capable of complex, dynamically changing response corrections, which can be controlled and adjusted with simplified, intuitive control specifications. Compared to traditional response-leveling methods, the compensation method and system requires less processing complexity and can easily be applied to different sound-reproducing systems. The compensation method and system, as a whole or in piece parts, can be turned on or off, moved from one frequency to another, or otherwise be changed by simple, intuitive commands.

These and other aspects and advantages of the present invention will become apparent from the following more detailed description, when taken in conjunction with the accompanying drawings which illustrate, by way of example, the preferred embodiments of the invention.

BRIEF DESCRIPTION OF-THE DRAWINGS

FIG. 1 is a block diagram of a sonic reproduction system incorporating a compensation system in accordance with the invention;

FIG. 2 is a block diagram of a compensation system having a plurality of modification filters, each having a plurality of adjustable parameters for modifying one or more of the frequency, time and phase responses of the filters;

FIGS. 3a–3e depict a plurality of response components for a loudspeaker;

FIG. 3f depicts the overall response formed when combining the individual responses of FIGS. 3a–3e;

FIGS. 4a–4e depict a plurality of adjustable modification responses for a compensation system, each response is adjustable to form a conjugate response to the response components of FIGS. 3a–3e;

FIG. 4f depicts the overall conjugate response formed when combining the individual frequency responses of FIGS. 4a–4e;

FIG. 7 depicts a waterfall plot wherein the arrows at the right show the increasing time axis;

Figure 15:
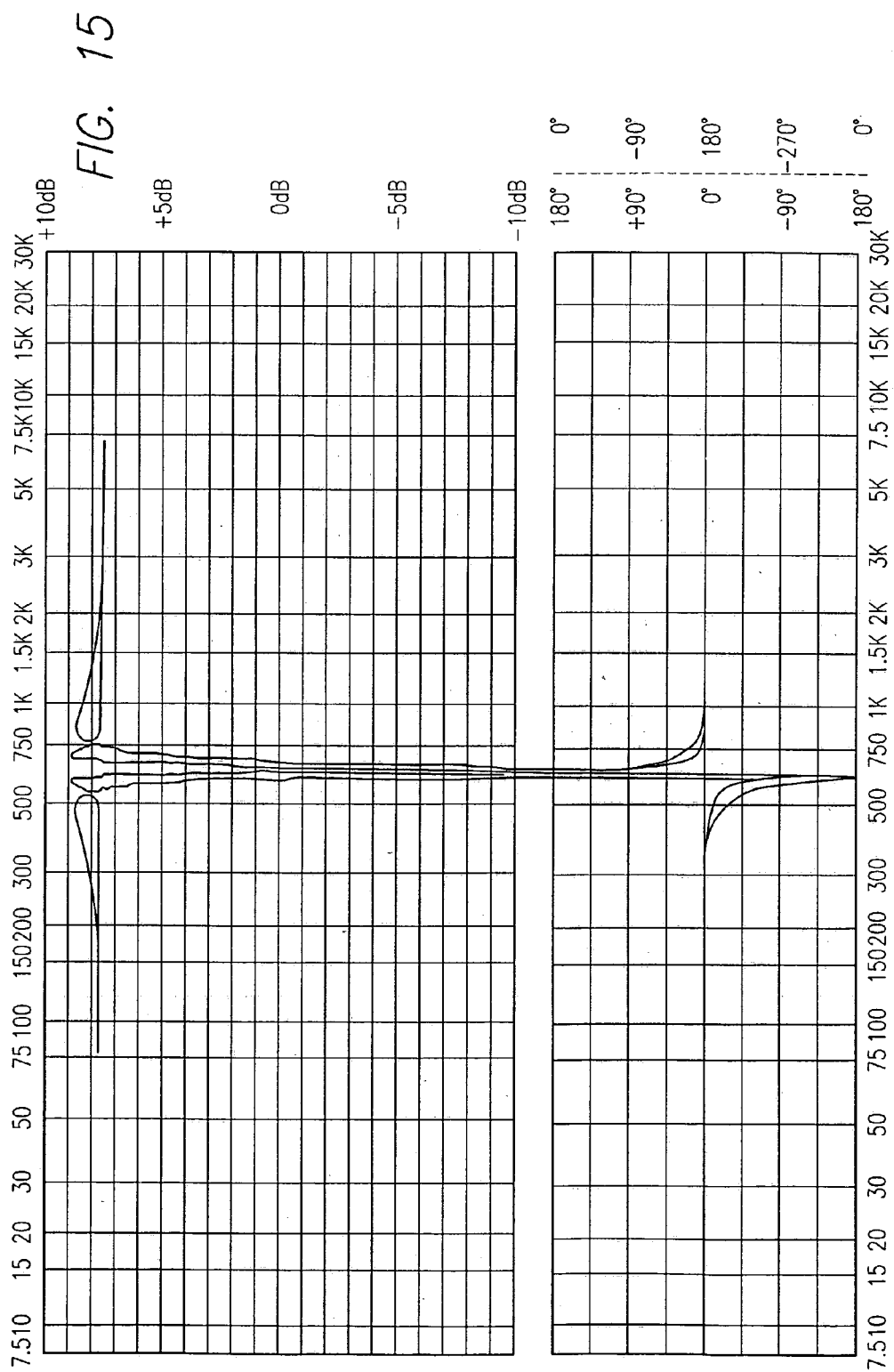
Figure 16:
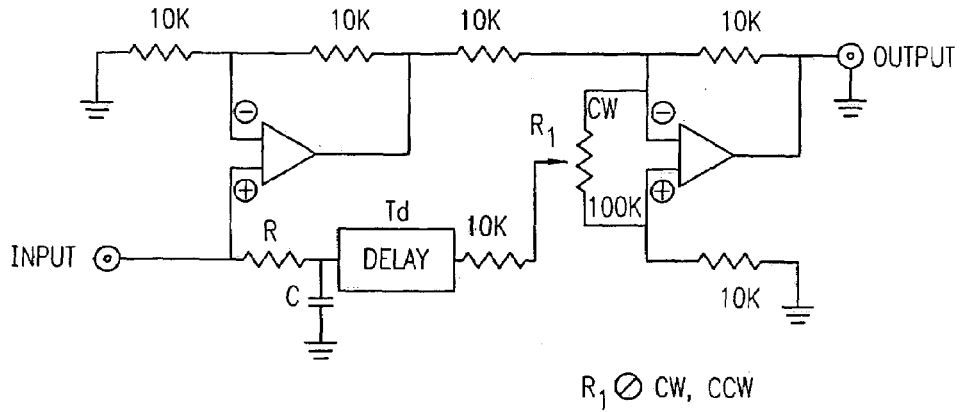
Figure 17:
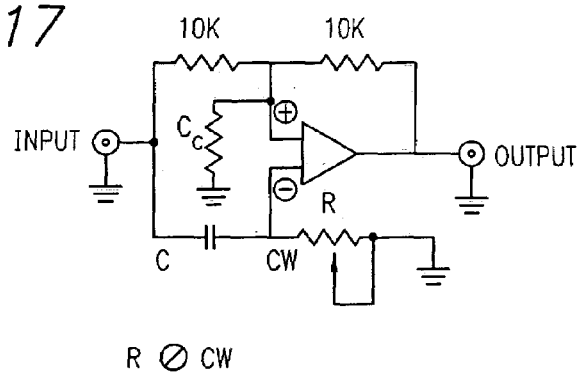

FIG. 13 includes a schematic diagram of a weighted notch filter and the responses for boost, and notch components and a combined response, obtainable using the filter;

FIG. 14 includes a schematic diagram of a multi-resonant weighted notch filter and the responses for boost and notch components and a combined response obtainable using the notch filter;

FIG. 15 depicts the frequency, and phase responses for a notch filter;

FIG. 16 is a schematic of a delayed interference simulator/compensator where CW equals the same response as interference, CCW equals a conjugate correction and RC equals a decrease compensation for higher frequencies; and FIG. 17 is a schematic of an all-pass or phase shift network.

DETAILED DESCRIPTION OF THE PREFERRED EMBODIMENTS

The following description focuses on the application of the present invention to a loudspeaker system. The invention, however, is not limited to such applications and may be applied to other sonic transmission and reproduction devices such as those set forth at the end of the specification.

Referring now to the drawings, wherein like reference numerals denote like or corresponding parts throughout the drawing figures, and particularly to FIG. 1, there is shown a system 10 incorporating the present invention. The system 10 includes a signal source 12, for providing an electrical audio signal. The signal source may be, for example, a CD player. The output 14 from the signal source 12 is input to a compensation system 16 which employs detailed features and aspects of the present invention. The output 14 is processed by the compensation system 16 to produce a compensated electrical audio signal 18 which is fed to a power amplifier 19 and a loudspeaker 20.

With reference to FIG. 2, the compensation system 18 employs a plurality of filters 24 which, either individually or in combination, exhibit individual compensation responses which simulate the frequency, time and phase responses exhibited by the various mechanical, acoustic and electromagnetic components of the loudspeaker. Associated with each of the filters 24, and thus each of the compensation responses, is one or more adjustable parameters 22. The filters 24 are created using DSP or analog circuits. Digital signal processing is the preferred implementation, since analytical models of loudspeaker behavior translate easily to the mathematical synthesis techniques used for designing digital systems. Analog circuits have distortion build-up in cascade architectures. Therefore, a practical analog implementation of the compensation system 18 is possible only when the analog designer is aware that parallel-connected circuit elements can be used when behavioral responses are isolated and non-interactive. Some parameter 22 adjustments interact with one or more parts of the compensation system. A digital implementation provides the ability to utilize a compilation of possible settings or to calculate these relationships as needed. When the compensation system is controlled from a computer the setup adjustments appear simple and intuitive.

Each of these computed and adjustable compensation responses can be scaled to a parametrically variable, feature, or design aspect, relating to size, a moving property, or acoustic radiation behavior, amongst other things. Time delays, maximum excursion limits, wavelength relationships, nodal and standing wave frequencies, boundary reflections and like properties of the speaker can be adjusted and used by the compensation system. Instead of compiling or reducing speaker elements to create a lumped response system, the compensation system uses minimum-phase equivalence and strings of non-interacting filters.

A typical overall response for a small speaker is shown in FIG. 3f. The same response is repeated at the top of FIG. 4. FIGS. 3a–3e shows a plurality of individual responses related to speaker components which combine to produce the overall response curve. FIGS. 4a–4e show a plurality of individual compensation responses which are adjusted via a plurality of adjustable parameters, e.g., $L_S$, $H_S$, $L_X$, $H_X$, etc., to produce a plurality of conjugate responses. Properties of the parameters are described in detail below. As shown in FIG. 4f, the individual conjugate responses combine to produce or an overall conjugate response. The combination of the overall speaker response (FIG. 3f) and conjugate response (FIG. 4f) produce a smooth response.

Figure 5:
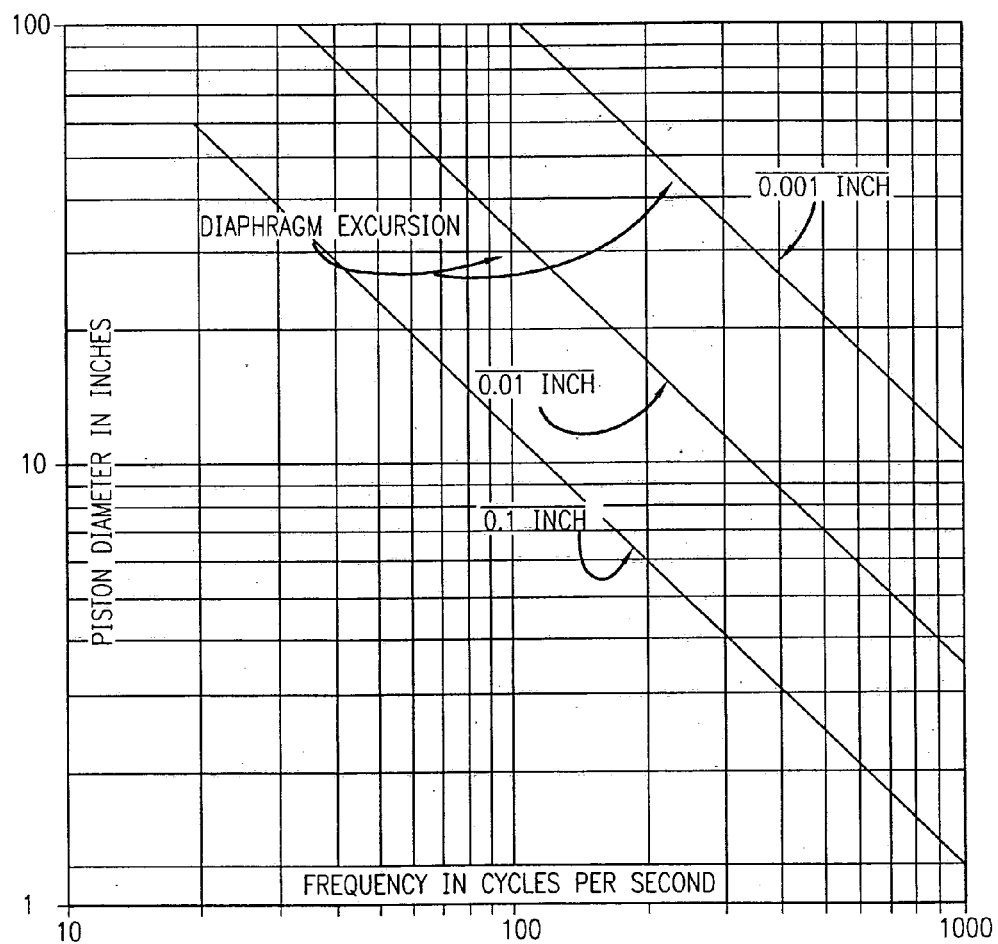
FIG. 5 is a graph depicting the motion for a circular cone to produce one acoustic watt output.

From FIGS. 3a and 4a, the first and second cutoff inflections for both high and low frequencies are evident. These points on the curve determine the frequencies for $L_X$, $L_S$, $H_X$, and $H_S$. When voice coil length and motional compliance capability are known, then a calculation or chart, similar to the one shown in FIG. 5, can help determine a reasonable frequency and amplitude for $L_P$. $H_P$ is treated in a similar manner. Related inflections, cutoff, and frequencies are shown in FIGS. 3b and 4b. Amplitude settings of $L_P$ and $H_P$ have subjective power handling and weighted compensation issues.

Self-resonance of the driver operating in its enclosure can be measured or calculated to yield $W_0$. The related $Q_0$ and $|A|_0$ settings can be experimentally measured or calculated from traditional models, provided the acoustic coupling factor has been removed. FIGS. 3d and 4d show this bass compensation.

Representations of a mechanical resonance, like $W_1$, are seldom used in conventional models. The higher frequency parts of FIGS. 3d and 4d show that acoustic response error and coloration from $W_1$ can be removed by setting $|A|_1$. A surround resonance is noted and a preset or default Q can be chosen to compensate a resonant behavior model typical of loudspeaker materials involved.

Nodes and interference behaviors are evident in FIG. 3e. Other examples in FIG. 6 reveal node jumps, interference, and related problems frequently called "cone cry" because of harsh, smeared sound. Waterfall or MLSSA plots like those shown in FIG. 7, can show the frequency and delayed breakup consequences typical of such high-energy moving interference. Hidden compensation notches $W_{CC1}$ and $W_{CC2}$ of FIG. 4e remove these frequencies and energy storage problems.

A slope or tilt EQ is added to achieve a best listener preference. FIGS. 3c and 4c show behavior and correction. Additional downward tilt might be added for subjective balance.

Figure 6:
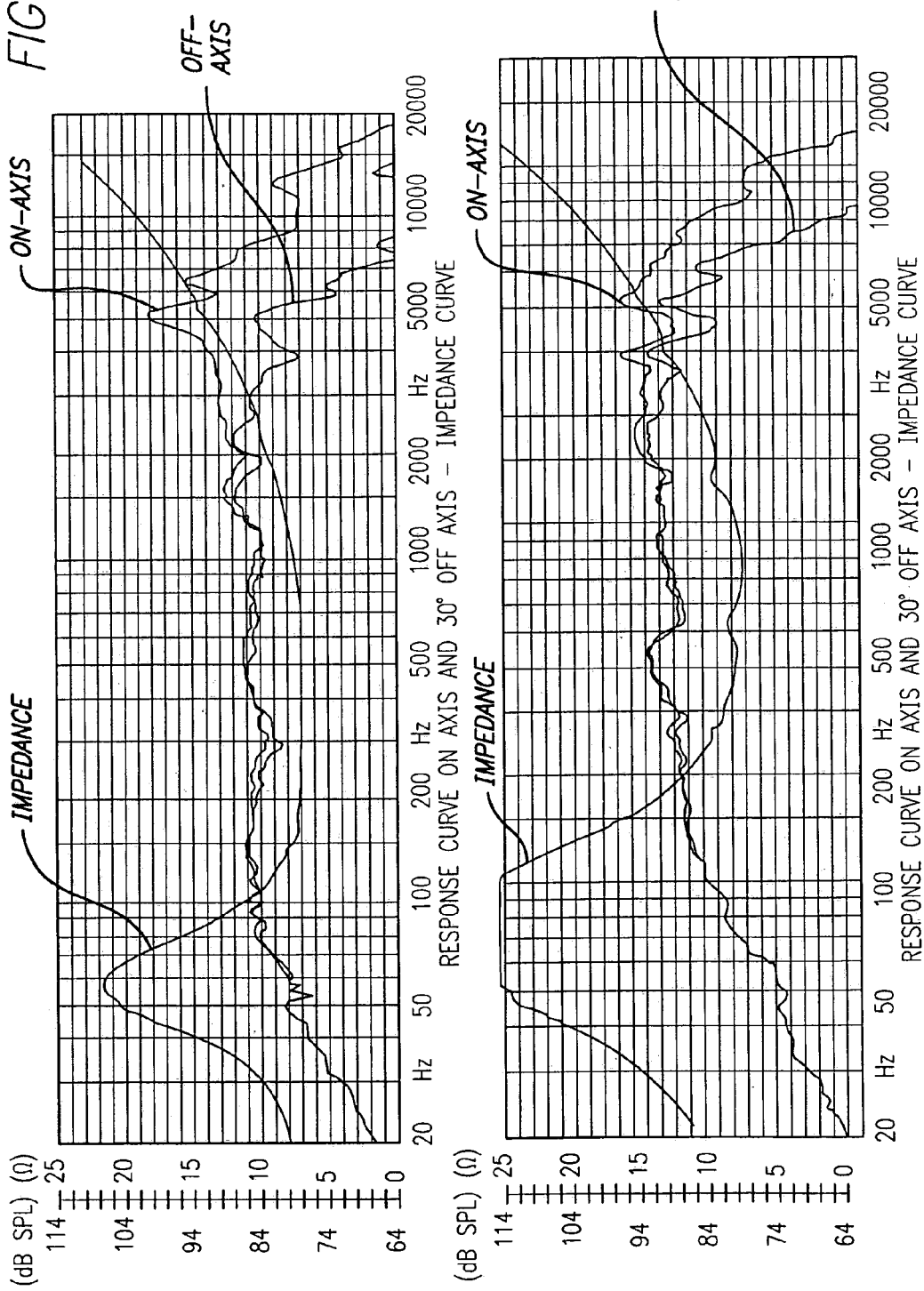
FIG. 6 depicts the frequency responses for two small loudspeaker drivers.
Figure 8A:
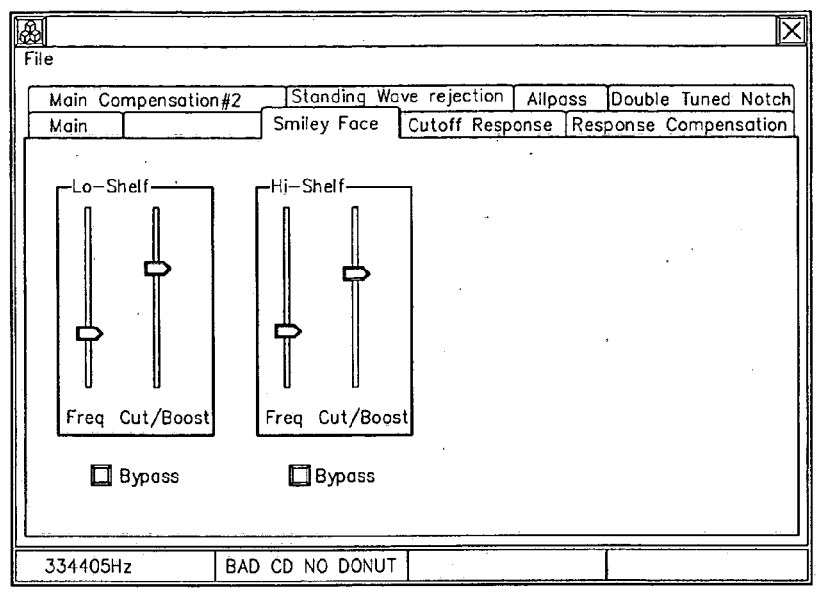
FIGS. 8a–8f depicts a series of graphical user interfaces for adjusting parametric controls for modifying the responses of the modification filters.
Figure 8B:
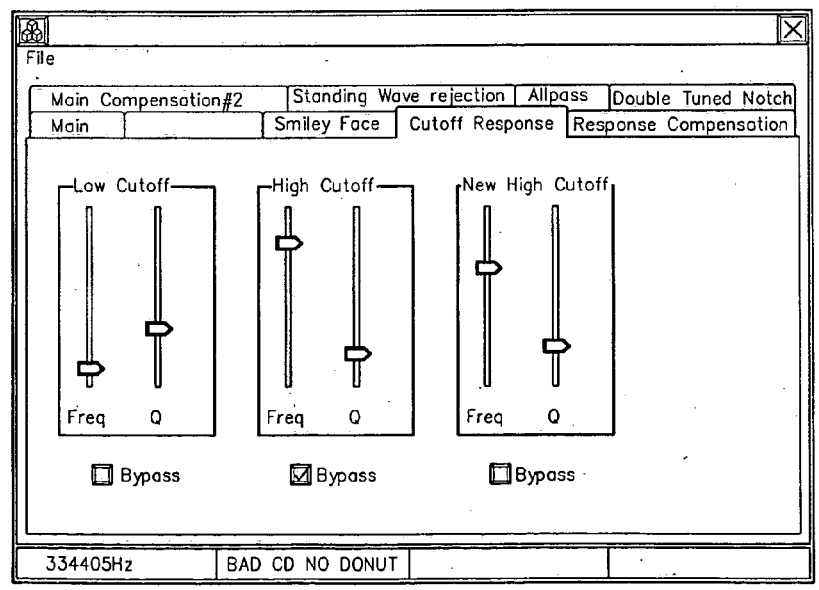
Figure 8C:
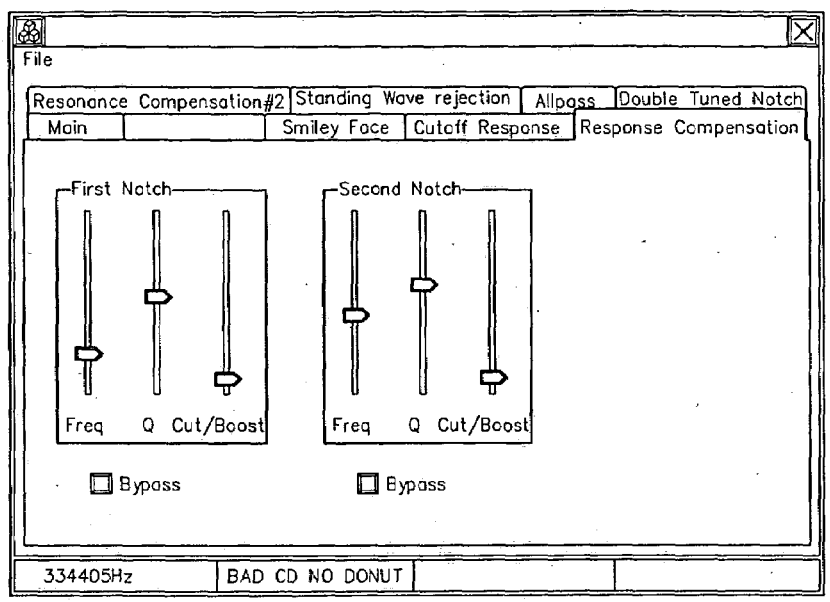
Figure 8D:
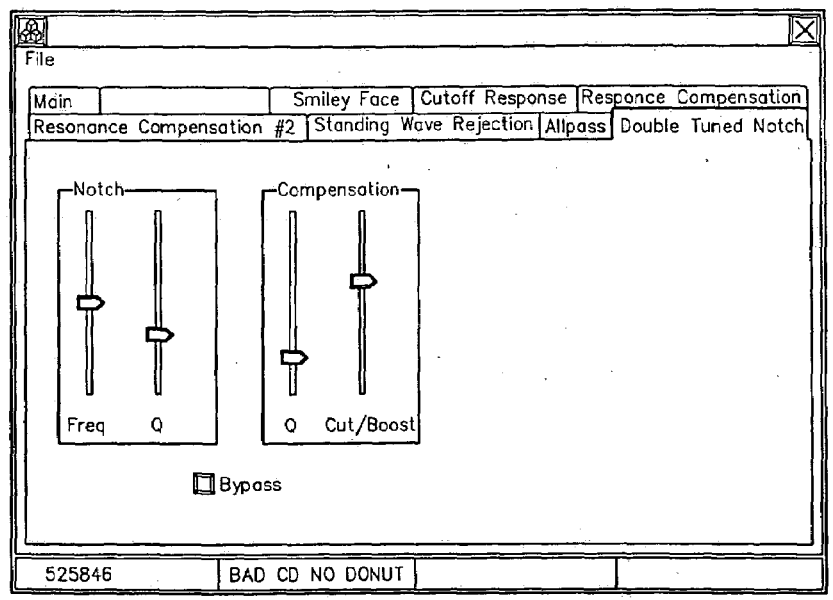
Figure 8E:
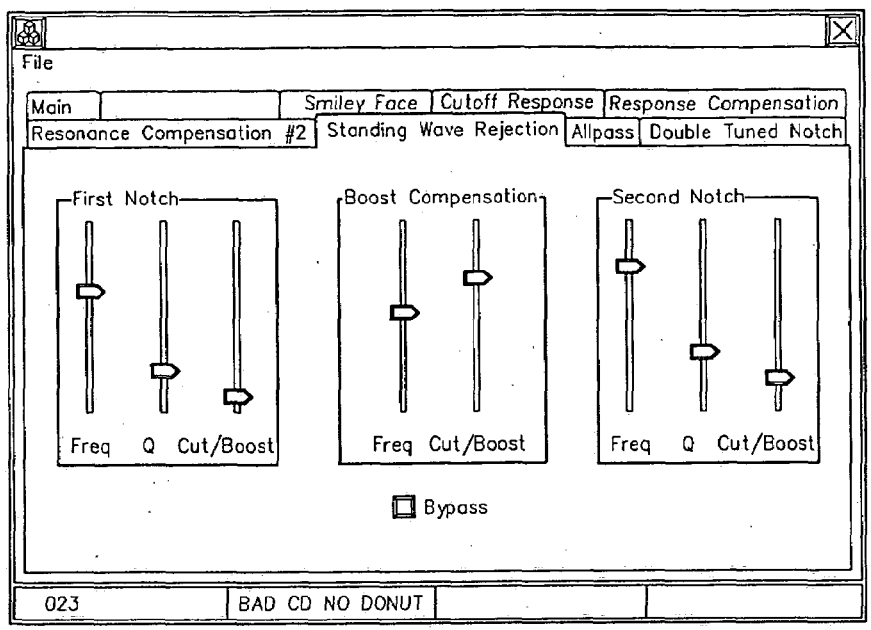
Figure 8F:
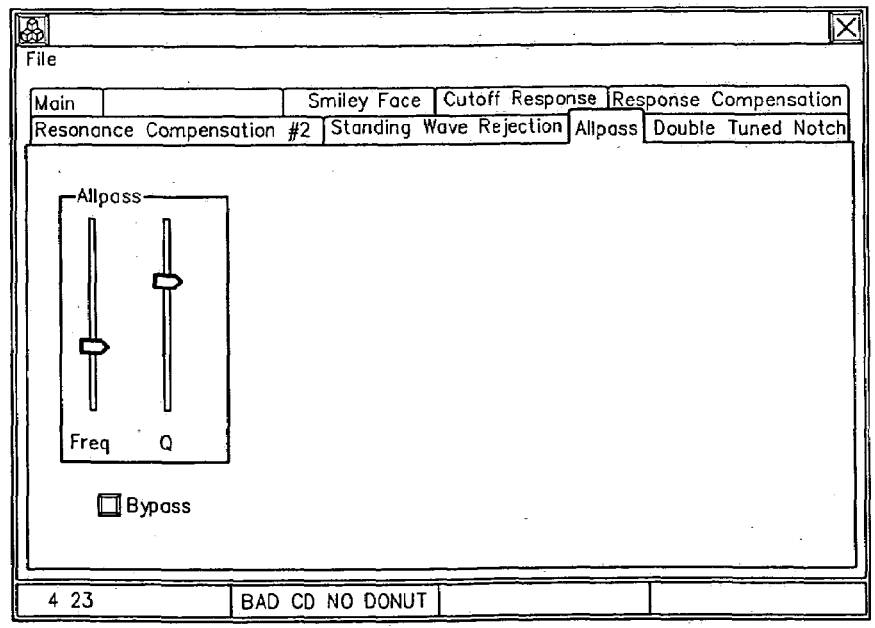

As can be seen, approximately 12 to 16 adjustments, each spanning as few as 8 bits of resolution, can make a very good conjugate correction. Representative frequency responses from two loudspeaker driver units are shown in FIG. 6. Note that, as indicated by the roll off of the response curve at the low end, the $W_0$ and second inflection response related to $L_P$ are missing because the driver operates in a very large enclosure. Other than this, the other parametrically related features are evident and adjustments can be worked out from these curves.

The following parameters allow for the creation of, simulations of, or conjugates to, the complex frequency, phase, and time responses of a loudspeaker. These adjustable parameters 22 and their operations can approximate zero-phase response, extend bass output, and remove mechanical sounds from a speaker (other parameters can be used in a similar manner). The individual compensations can be performed digitally or using active or passive analog circuits, such as RC circuits, analog resonators, or fully parametric circuits like state-variable filters or biquads.

| Term | Acronym | Description, Relationships |
| --- | --- | --- |
| Low Crossover | $L_X$ | Radiating area, compliance, air volume, acoustic coupling, and $B_L$ factors. (first inflection @ +/− 6dB per octave) |
| High Crossover | $H_X$ | Mass, radiation area relationships, stiffness, $B_L$ factors. (First inflection at +/− 6dB per octave) |
| Low Boost Shelf | $L_S$ | Design limit, sonic balance, (XdB stops slope) |
| High Boost Shelf | $H_S$ | Design Limit, power handling, useful response linearity (XdB stops slope) |
| Low Peaking | $W_L$ | Boost for second coupling inflection. Hidden compensation for high-pass or low frequency limit filter. (default cutoff slope, XdB peak) |
| High Peaking | $W_H$ | Boost for second high-frequency loss inflection. Hidden compensation for low-pass or high-frequency limit filter. (default cutoff slope, XdB peak) |
| Motor | $B_L$ | Force, back EMF, inductance factors. Modulates responses and effects of parametric values |
| Bass Resonance | $W_0$ | Volume, compliance, area, damping, $B_L$ factors (frequency, Q, amplitude) |
| Port Tuning | $W_B$ | Bass tune model (traditional) (input for double-tuned filter model) |
| Mechanical Resonance | $W_1, W_2$, through $W_n$ | Parts of system including panels, cones, surrounds, and domes (frequency, Q, and amplitude) |
| Settling Resonance | $W_{CC1}, W_{CC2}$, through $W_{Ccn}$ | Node Modes: standing waves, bell modes, delay-coupled interference (weighted notch frequency, Q and amplitude) |
| Coupling Factors | $|A|_1, |A|_1 \ldots |A|_n$ | Resonant magnitude (always adjustable parts of resonators +/− dB) |
| Loss Factors | $Q_0, Q_1 \ldots Q_n$ | Resonant bandwidth (default or adjustment possible +/− dB) |
| Tilt | dB | Departure from frequency-balanced output: $B_L$ factors. Subjective balance and default placement equalization |
| Wave Interference | Td | Dimensions: enclosure, floor, wall, speaker and listener placements. |
| Equalization | EQ | User operated: room, other traditional |

-continued

| Term | Acronym | Description, Relationships |
|---|---|---|
| Power | Pw | Maximum low-frequency input or output. Analog proportional or threshold switch detector. |
| Mode Switch | SW1, SW2, etc. | Dynamic process: operate or select |

Somewhere between 8 and 32 parameter adjustments might be used to program the compensation system and operate an adequate compensation process. Since parameters are related to specialized physical and behavioral aspects, data requirements for adjustment ranges and precision are much smaller than needed for coverage of human perception. Eight-bit resolution is adequate for many of these, so that a one-time data stream of 1–5 kbits characterize a very complex response from the model. A description of the foregoing parameters follows.

Low Crossover ($L_X$) or Acoustic Coupling—Low frequency output depends on the size of radiating surfaces. The 6 dB-per-octave loss from this relationship is inherently compensated by increased cone motion provided the back voltage from the motor structure is small compared to the driving signal. If compliance were infinite and the motor produced force without velocity restriction, this idealized configuration would have flat response. Real systems having air volumes, mechanical stiffness, and velocity limits have two practical crossover points where the response breaks from flat and converges to 6 dB/octave and then to 12 dB/octave bass loss. Usually, the second inflection is near the lowest useful response of the loudspeaker and often becomes impractical to compensate. The control parameter for this compensation is frequency in Hz and the conjugate response (specific compensation) is a +6 dB/octave boost for decreasing frequency. This boost starts at the first response inflection from the speaker. The value for this parameter can be measured by applying a test signal, e.g., sine wave, to the speaker and measuring the response. The value may also be calculated based on physical characteristics of the speaker such as cone and coil mass. The value may also be derived from a speaker model such as a standard Theil/Small model which is generally provided by the speaker manufacturer.

High Crossover ($H_X$) or Mass-Compliance Factor—High frequency output depends on the size and velocity of the radiating surfaces. Usually, the wavelengths of interest for frequencies near cutoff are small compared to the motional part of the speaker creating the output. Stiffness and damping properties of the cone material affect this transition from whole surface radiation at lower frequencies. Higher frequencies radiate nearer the voice coil. Moving mass eventually creates a 6 dB/octave reduction of motion with increasing frequency. Leakage inductance from the motor assembly adds further compliance to the system to create a second inflection making a 12 dB/octave drop at the highest practical frequencies. These losses, combined with decreased radiating area, create a reduction of acoustic output. At lower frequencies, the two relationships can be skillfully balanced to create flat acoustic response. The control parameter for this compensation is frequency in Hz and the conjugate response is a 6 dB/octave boost with increasing frequency. The value for this parameter can be measured or calculated in a manner similar to that previously described for low crossover.

Low Boost Shelf ($L_S$)—Maximum boost from $L_S$ is restricted to practical limits from the amplifier power, cone motion, voice coil length, enclosure size, and intended bass extension. These requirements conflict and interact, e.g., longer voice coils require bigger amplifiers and suspension parts. For example, an extended coil can provide greater linear excursion and bass output potential, but efficiency decreases unless flux energy from the magnet is increased. Increased excursion requires bigger surrounds and the cone diameter must be increased to maintain the same radiating area and bass output. Bass resonance is lower, but the speaker must be physically larger, and the increased moving mass further reduces efficiency. If amplifier power is limited the enclosure becomes larger. Manipulation of the $L_X$, $W_0$ (described below) and $L_S$ parameters makes efficient or extended response loudspeaker designs with much less compromise. In addition, the $L_S$ parameter can be made to change or track different volume control settings and program dynamics, so that the speaker system can operate near its maximum capability for a wide range of conditions. The $L_S$ parameter is affected by design and construction factors, which include radiation area, compliance, and force factor of the driving motor. The modeled parameter can track changes to these factors with very little interaction. The $L_S$ parameter is +/–dB. The $L_S$ parameter setting can be determined by experimenting with compromise tradeoffs via test measurements.

High Boost Shelf ($H_S$)—Practical maximum performance and power handling capability of the speaker limit the maximum high frequency boost. In some applications the $H_S$ parameter might be set to reduce perceived distortion from a program source instead of from the speaker. As with $L_S$, the internal operational settings can be made to change by command. This feature could help cover up increasing distortion when other parts of the system, including program material, is pushed to operate above their maximum linear power capability. The $H_S$ parameter is +/–dB. Its setting is best determined experimentally via test measurements.

Low Peaking ($W_L$)—A resonant bass cutoff is often preferred. Recordings are balanced for this and most speakers are designed to have self-resonant bass enhancement. Generally, larger speakers have lower resonant frequencies and listeners associate value to this relationship. The $W_L$ parameter provides a low frequency resonant boost below the natural self-resonance ($W_0$) of the speaker itself. When a low $Q_L$ compensating response dip removes the $W_0$ effect, the speaker system behaves electrically and sonically as if it were larger. It will not have the boom or box sound of an equalized small speaker. To prevent excess distortion and power draw, the signals below $W_L$ are attenuated rapidly and the high-pass filter involved tracks the $W_L$ parameter setting. This action has subjective factors similar to weighted compensation, since frequencies below cut-off can be weak but still audible when not masked by other sounds in the $W_L$ critical band of human hearing. Generally, $W_L$ peaking is adjusted and set to control power and distortion for maximum playback conditions. For other conditions, the high-pass or sub-bass filter can be shut off and parts of the low-pass filter ($L_P$) moved or changed without obvious subjective consequence. As mentioned, the $W_L$ parameter can be dynamically modulated to extend bass or reduce distortion. Adjustments to the response of the low-pass filter include peak frequency ($W_L$) and amplitude $|A_L|$ in dB. Default $Q_L$ setting is implied.

High Peaking ($W_H$)—A resonant cutoff may be preferred to compensate for a second cutoff inflection, or it can be used to restrict reproduced bandwidth. The first application can extend response and reduce group delay distortion. Bandwidth restriction might be needed to make a distorted program sound better. A peaking resonator and tracking high-pass filter ($H_P$) operate in a similar manner to the low-frequency peaking system. The high-pass filter can be aligned to create a weighted response limiting and to provide a peaked cutoff response preferred in contemporary design practice. High-pass filter adjustments include peak frequency ($W_H$) in Hz and amplitude ($|A_H|$) in dB. Default $Q_H$ setting is implied.

Motor ($B_L$)—Properties of the magnet structure and voice coil are consolidated to a traditional representation. Voice coil diameter, winding length, gap flux, pole dimensions, etc., are parts of traditional speaker models creating motor and generator equivalents. Force and back EMF relationship, with electrical current and mechanical motion, as well as other factors related to mechanical properties, get simplified representation. Sometimes leakage inductance and mechanical mass relationships are included. These elements are measured, calculated, or derived by various means to create a group of motor-related parameters that can affect many performance aspects of the speaker. Adjustable parameters to the compensation system and its processing are dependent on $B_L$. Therefore, if needed, the model can have relationships set up so that $B_L$ changes can modulate parameter settings. For example, the $B_L$ specification can be used to track or readjust other parameters for similar speakers having different magnet weights, voice coil lengths, or other electromechanical factors. The adjustable $B_L$ parameters can be: flux x length, volts x velocity, peak excursion length, and resistance/inductance or time constant.

Bass Resonance ($W_0$) or Self-Resonance—This is the natural bass resonant frequency of the loudspeaker. Its value is determined by air volume, mechanical compliance, radiating area, damping, moving mass, motor characteristics, and other design features of the speaker. Unlike traditional bass models, an acoustic coupling factor is not part of the $W_0$ response, since it has already been accounted for in the Lx parameter of the compensation system. This arrangement prevents interaction between adjustment parameters and the equivalence to mechanical behavior transforms to an LCR resonator equivalent of mechanical behavior. User command language of frequency $W_0$, $Q_0$ and coupled energy or amplitude $|A|_0$ can specify conjugate responses to the mechanical resonant behavior. Because the speaker behavior and correction responses for the system are of the same order, but opposite amplitude, the group delay performance can be very good. Adjustments are $W_0$ in Hz, $Q_0$ as a number, and $|A|_0$ in dB. These adjustment values can be experimentally determined by very-close-range instrumentation, position sense transducers, or by calculation.

Port Tuning ($W_B$)—Many speakers are designed to provide a secondary bass resonance intended to extend frequency response or improve power handling. Physical structures to do this include ports, tubes, passive resonators, labyrinths, other woofers, etc. Much literature has been devoted to modeling and tuning these systems, usually to achieve flattest possible frequency response. Such models, combined with the compensation system, have the potential to extend bass, improve transient response, and improve efficiency without adding cost to the speaker. Greater power handling and extended bass capability can be structurally designed and the resulting frequency response irregularity and end band distortion compromise from using this strategy can be removed by conjugate correction. When this choice is made, ports can be larger and tuned lower, enclosures made smaller, along with other changes to improve bass. The resulting consequences of rough response and sub-bass overload are reversed by the compensation system. Flags or switches can be part of a control operation, which identifies program conditions or response states at the loudspeaker. Limit conditions from samples or tests determine switch states for this feed-forward/feed-back type system. Then, parameter coefficients are chosen from the switch or status inputs. In this manner, the compensation system can operate with fuzzy logic controls or other means to prevent unnecessary toggling or changes to parameter values. For example, different volume control settings, program levels, or bass content can change parameter coefficients and alignment to achieve a higher power or flatter response optimization. The switching operation is likely to be audible, but the control hysteresis provides strategic changes that are less apparent or objectionable. Inexpensive equipment is intended and likely to overload or be pushed beyond a reasonable linear operation. The compensation system operating with appropriate control logic can activate soft and loud operational states, each having optimum alignments, without creating a continuum of distortions inbetween.

Mechanical Resonance ($W_1$, $W_2$, through $W_n$)—Many parts and actions of a speaker system behave like resonators. Unlike $W_0$, most of these are unintentional and they usually add to the acoustic output of the speaker. These include flexure and mass behavior of the domes, cones, and surrounds, as well as cabinet resonance, among others. Equivalent LCR behavior is parameterized to non-interacting individual corrections or adjustments similar to those for $W_0$. Resonance adjustments are $W_1$, $W_2$, through $W_n$ in Hz, $Q_1$, $Q_2$, through $Q_n$ (described below) in units, and $|A|_1$, $|A|_2$ through $|A|_n$ (described below) in +/−dB. Often a small, low-Q resonance that appears similar to room responses has sonic impact. Unlike a test microphone used for traditional response leveling, a listener can move around and, in time, can sense and become aware of signal decays that collapse to broadband resonance. Conjugate correction eliminates this difficulty and helps to improve the outcome from ancillary equalization systems.

Settling Resonance ($W_{CC1}$, $W_{CC2}$ through $W_{CCn}$)—The hidden compensation processes using multi-resonator notches and weighted side energy enhancements are placed in frequency and adjusted by these control parameters. Sonic consequences from delayed nodal resonance and standing wave interference is diminished or removed.

Coupling and Loss Factors ($|A|_0$, $|A|_1$, through $|A|_n$ and $Q_1$, $Q_2$, through $Q_n$)—Q parameters for some frequencies can be estimated default values which work for materials, designs, and construction materials common to speakers. Since it is almost impossible to casually determine Q from a response plot or simple measurement, the fixed value is practical, and the default choice simplifies and reduces the number of adjustments.

Wave Interference (Td)—The finite dimensions of speaker enclosures can create wave-related interference pressure behind the radiating surface. Usually this problem is ignored because of the complexity of the correcting response. Expensive speakers are built with big motor assemblies having tight magnetic coupling to combat back-wave interference. Often these systems have inner baffles, layerings of different types of absorbent material, specially shaped rear cavities, or transmission line tubes to help remove the interference. Typical speakers exhibit constructive/destructive wave interference from their simple box type enclosures, which ultimately cause response ripples of increasing occurrence with frequency. The irregularity worsens as the shorted-turn effect, and damping from $B_L$, are reduced by smaller magnets, reduced steel and other economic factors. Corrections are made by a conjugate opposing response from a delay-and-feedback-loop process.

Although an analog implementation is possible, DSP methods are more economical and by their nature make good equivalence to the physical behavior and problem to be fixed. A similar correction can reduce reflected interference from the floor, table top, walls, etc.

Tilt(dB)—Most contemporary listeners prefer a speaker whose response drops slightly with increasing frequency. When a speaker is made less expensive its response tends to rise. The compensation system corrects many problems and changes that occur from reducing magnet weight, improving efficiency and extending high frequency response. However, the flat acoustic balance created from these conjugate corrections may sound either muddy or thin compared to a contemporary tone standard. Tilt creates a compensating response slope. The tilt parameter operates like a tone control and is used to achieve a desired bass-treble balance. Internal manipulation of the $L_X$ and $H_X$, as well as traditional response leveling methods or processes create this response.

Delay or All-Pass—This parameter moves the signal in time to compensate for transducers radiating high and low frequencies from different places. Adjustments can reduce group delay distortion, improve phase match to a sub woofer and align transient response. Adjustments can be made using physical or electrical measurements.

FIGS. 8a through 8f show control panel displays and menus used to adjust parameters. Measurement data, design expressions, and response curves provide useful information to adjust or tune the system to the loudspeaker. The system generates conjugate responses to those of the speaker and silently removes delayed or long-settling mechanical sound. Experience has shown better performance for many listening positions compared to more complex conventional leveling practice. Common digital processes can be utilized for the implementation of these functions. Exemplary known digital processes are shown in Appendix A. Alternative known digital implementations can be used to achieve a wholly similar result.

The compensation system may also be implemented using analog circuits. However, parts of multi-resonators or coupled functions are not likely to track wide adjustment ranges unless they are complex. Hence the analog circuits are shown for their functionality and similarity to well-known better DSP equivalents. These circuits have adjustable parametric controls, but they require component changes to simulate the parametric alignment accuracy inherent with the digital system. The following examples are traditional circuits that have semi-parametric adjustment capability and produce conjugate responses like those described.

Figure 9:
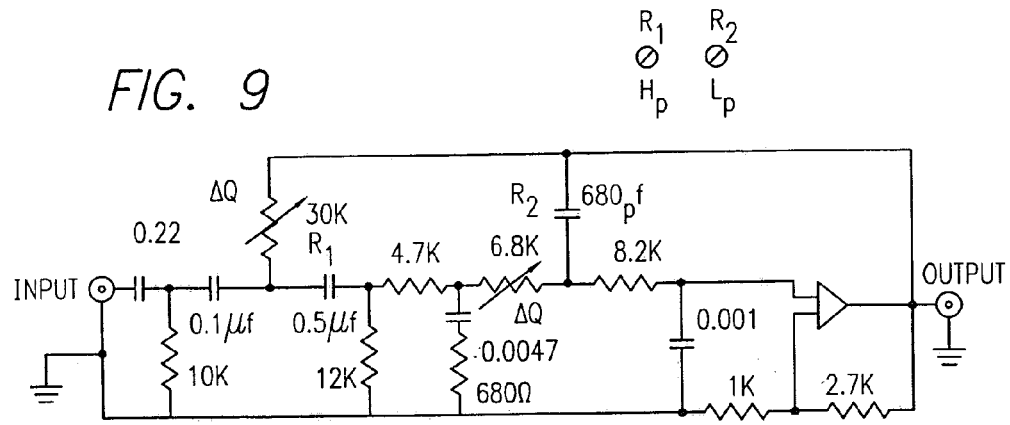
FIG. 9 is a schematic of an low-pass/high-pass peaking filter, where all Cs must change to move frequency.

Cutoff Filters—Sallen and Key circuits can make active high-pass and low-pass filters with adjustable peaking responses. FIG. 9 shows the two filters configured to a single op amp. Mid-band response is flat and cutoff slopes are + and −18 dB per octave. Peaking amplitude of $L_P$ and $H_P$ are adjustable and correspond to FIG. 4b. However, the frequencies must be preset for this circuit. For this example, the two sections do not interact with each other because of their wide frequency separation.

Figure 10:
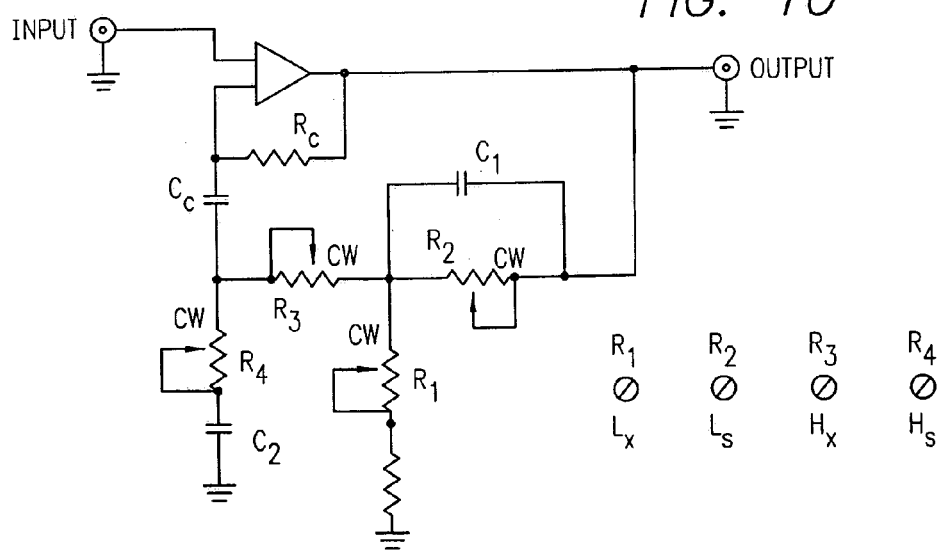
FIG. 10 is a schematic of an active RC or constant slope equalizer that boosts and has approximate parametric independence, where Cc and Rc are both very large to bias the op amp.

Constant Slope Equalizers—RC time constants are changed in an active feedback circuit to create response curves like FIG. 4a. The circuit shown in FIG. 10 is the boosting half of a sophisticated parametric tone control. Its adjustment range is limited for good parametric independence between shelf and crossover.

Figure 11:
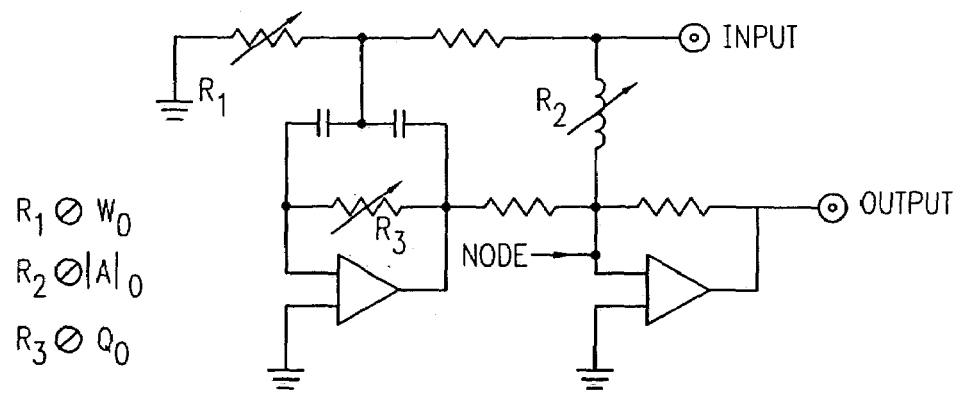
FIG. 11 is a schematic of a frequency movable notch.
Figure 12:
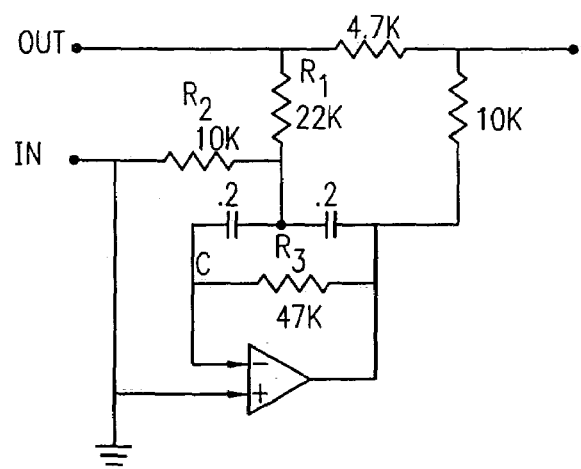
FIG. 12 is a schematic of an alternate configuration of a frequency movable notch.

Parametric Notches—FIGS. 11 and 12 show simple analog notch circuits having a wide tuning range. Notch depth stays constant but Q increases with frequency setting. Component values can be chosen to provide a reasonable approximation to $Q_0$, $Q_1$, through $Q_n$ for practical adjustment ranges.

Weighted Compensating Notches—A composite filter element is made up from one or more sharp notches, each having-energy added to either or both sides of the reject frequency. When its rejection and boosting energies and bandwidths are carefully chosen, the filter system can remove unwanted energy with little compromise or alteration to sonic balance. Reject notches, for this purpose are sharp, have high attenuation and are generally high-Q. The side band compensations or restorations are best made from boost responses at both sides of the rejection. However, a one-sided compensation may work better for speakers having combined response roll off and interference energy problems. The unsymmetrical boost helps flatten the frequency response. Other aspects are the same. Compensations can be very small, have low Q, and the average pink noise energy in a one-half to one octave band centered to the correction is constant when the process is on or off.

Decay from sounds can perceptually shift to low-Q sideband frequencies. Consequently, a double-tuned alignment for better immediate transient response settling is preferable to a one-sided or single-tuned boost method. The resulting composite filter can be carefully tuned and scaled so that it can be silently tuned over a useful frequency range. Without weighting, the small response losses on either side of the correction contribute to a nasal sound. The coloration may be subtle but when more corrections are used the losses can overcome any advantages. This is particularly true if the response is just made flat, as it might with standard-practice equalization. Weighting eliminates the compromise and allows multiple corrections to be more effective and free of sonic interaction and also eliminates loss when unintentional correction is applied to a speaker having different behavioral properties.

For either implementation, neutral weighted response notches can be made up from resonant and anti-resonant responses added to the signal. With reference to FIG. 13, a correction element might incorporate a single high-Q notch, whose frequency is centered on the behavior mode. One low-Q boost response is placed at the same frequency to provide the compensating equal-weight energy. The circuit portion of FIG. 13 shows a practical combination of an active circuit notch and passive LRC boost resonator in a feedback path. Both parts create the weighted response notch. However, the tuning range is limited, and the low-Q boost is likely to be audible, since the human hearing perception can resolve transient sounds decaying to a low-Q resonance.

A better alternative is to use two low-Q resonant boost responses, each tuned and placed at one or both sides of the high-Q notch. FIG. 14 shows an example made from four tunable bi-quad resonators or state variable filters. Two of the filters create close spaced high-Q notches and the other two provide the boosted low-Q energy at the outer high and low sides. These state variable filters are easily created with DSP processors, and they maintain constant Q and notch depth over a wide tuning range. The analog system creating the responses shown in FIG. 15 has eight precision variable resistors ganged on a single shaft to tune the $W_{CC1}$ or weighted notch parameter. FIG. 13 shows a circuit for one of four sections. FIG. 15 shows response curves for two different Q settings and these correlate to those in FIG. 4d. The double-tuned boosts can be aligned to yield a faster and smaller settling response to transients. A double-tuned notch like that from the figures offers similar advantages and also provides a dead-band or band-reject capability to accommodate manufacturing tolerances from one speaker to another. Side frequency boost is still needed and double-tuned resonators are best used.

Other variations and simplifications can be made when adjacent behavioral modes have similar properties, as is likely with most speakers. Two or more rejection notches can share Q and amplitude settings as well as compensation boost. Combinations include two notches with three boosts, two notches with two asymmetrical boosts, three with two, etc. A single low-Q boost with a frequency halfway between two notches can be used. Three low-Q boosts with frequencies below, above, and between are a better variation. For all of these implementations, the notch depth is often great and the side frequency boost is usually small. Usually, the overall energy response to random noise averaged about the compensation region is made to be the same or slightly higher than without correction.

Delayed Interference or All-Pass—A hybrid analog-digital CCD device can create a small, convenient tunable delay. Though performance may be poor, they can be connected or configured like the example in FIG. 16 to provide interference-like behavior. The circuit can create approximate conjugate responses to wavelength related reflection and transmission behavior from walls, tables and the insides of speaker enclosures or other parts of the transmission path or system. The circuit can be set to create an inverted comb filter or additive interference like response which would be opposite in time, phase and amplitude to subtractive interference loss from reflecting surfaces. The correction boosts where interference takes away. The circuit can also be adjusted to have a comb filter like response to cancel additive energy from reflections within the speaker enclosure. Better time delay interference filters or comb filter like responses can be made from DSP processes. Both the analog and the DSP can be configured to be relevant to the physical reflection model and like other parts of the correction system, are controlled by parametric adjustments related to physical behavior. The delay interference path filter has controls relating to dimensions, surface absorption, and the amount of interference correction needed.

With reference to FIG. 16, Td relates to the difference between the direct path from the speaker to listener and the longer bounce path also from speaker to listener. Td also relates to the out and return path between the speaker and an opposite surface inside an enclosure. A wall behind the speaker can be characterized the same way. Larger Td gives a larger distance. RC relates to surface roughness or absorption at high frequencies. Larger RC product for greater loss or faster attenuation of upper frequency comb filter response and correction. The control R1 adjusts the magnitude of the response or correction. CW direction increases subtractive responses while the CCW position near the +input to the op amp gives maximum additive responses. The circuit produces an interference response whose amplitude decreases with frequency. This matches or simulates losses of absorption materials of practical speakers. Much of the irregular response from small speakers can be experimentally changed to something that appears to be more easily processed by the compensation system. Usually, the delay setting to do this matches the back arrival wave relationship expected from the speaker enclosure. When it does, this one adjustable parameter equals a multitude of conventional response-leveling processes.

FIG. 17 is an all pass or phase shift network. Its frequency response is flat however its output is in phase and high frequencies and out of phase at low frequencies. The circuit alters transient response without changing frequency response. The variable control increases the transition frequency as it is turned CW. This element is useful to correct group delay and other transient related responses.

As previously mentioned, mechanical disturbances produced by speakers are often audible, yet invisible or hard to interpret from response measurements made using a frequency sweep and microphone. Traditional compensation methods using a deep notch usually result in either a nasal sound or undesirable balance aberration. The weighted compensated notch filter of the present invention solves this problem and yields some other advantages as well. When two drivers (woofer and tweeter) are crossed over by just a capacitor or by circuits that overlap frequencies, one or both drivers can have interference compensation without perceptual loss to the other. The same applies to different listening positions. One position having a bad response can be compensated without compromising the sound for other listening positions. The correction is hidden by the weighted side energy. Since good listening positions are not compromised by the correction, a wide range of listening positions can have good sonics. This feature is particularly useful to horn-type loudspeakers for theater sound, where slightly different corrections are needed from one installation to another. By using default optimization for a class of speakers or construction features, parametric control and adjustment is simple and intuitive.

Some of the most important behaviors of loudspeakers (with respect to acoustically perceptible effect) cannot be modeled or implemented from traditional methods. Such behaviors include interference and resonant coupling, as well as nonlinear consequences from such behaviors. In addition, other spatial factors related to stiffness of moving parts and high frequency de-coupling for motions away from a driving voice coil need to be considered. Any of these can create source movements, delayed energy release and phase error to binaural hearing. Often, such destructive responses can be invisible or very difficult to interpret from traditional microphone-and spectrum-analyzer calibration methods.

An example of a parametrically addressed compensation for a specific physical effect is compensation for mechanical de-coupling in large full-range speakers. Such speakers are usually designed to have the entire cone move at low frequencies. At high frequencies, only the inner part of the driver is the primary active radiator. The rest of the cone is intentionally de-coupled to attenuate its nodal breakup. This design choice changes the position of an equivalent radiation source. A linear correction to move high-frequency radiation forward in time uses complex pass filters to create band-limited delay of the lower frequencies. Then, as frequency increases, a latent delay decreases thereby maintaining a phase match to the response order of the speaker. Some group delay distortions can be removed this way. A physical dimension from the speaker along with attenuation and speed-of-sound properties of the cone can yield information to specify a correction from a dedicated filter process. However, the delay effect and de-coupling frequencies can be experimentally determined to yield parameter values. If some of the speaker parts change size or attenuation properties, new values can be extrapolated.

An additional example of a parametrically addressed compensation, which is difficult or impossible to compensate using traditional methods, is compensation for Doppler modulation in small speakers. Computer and multi-channel sound systems require small speakers to play very loud. The resulting combination of fast, high-displacement cone motions can impart an additive or subtractive velocity to the sound reproduced. The low-frequency movements of the speaker cone impart a Doppler modulation effect by moving the effective high-frequency radiating area. The effect is quite annoying and creates a sound typical of small speakers struggling to play loud. When radiating area, frequency, and acoustic power output are known, a reasonably accurate calculation of the resulting cone motion and Doppler radiation factor can be made (see FIG. 5). An opposing alternating time delay is created for correcting the loudspeaker response. This multiplicative or non-linear process can make the equivalent radiation source steadier so that non-linear distortion is reduced. A good behavioral model of the speaker and a single dimension parameter can specify the correction. Any such open-loop or feed-forward non-linear correction is very difficult to accomplish. Modeled time-delay modulation is much better as it provides the exact conjugate response correction. The example is included here because cone motion from bass drivers is reasonably predictable from the model, and instantaneous correction from DSP methods will become more practical in time. Experiments were performed by using CMOS-type analog delays operating from voltage-controlled oscillator clocks. One path compensates for latency from both "bucket brigade" devices and the other receives the variable clock to produce delay modulation.

For nodal flextures, wave interference and non-linear motion situations, the removal or attenuation of behavioral responses by using the weighted-notch process is a good compromise. The weighted compensation can be parametrically moved to where it is needed. If needed, its severity can be modulated to best match program dynamics, distortion from the loudspeaker, and human critical-band hearing perception.

Additional bass output capability and response extension can be had when the dynamics of the audio signal are detected and used to change parameters or hidden compensations. This technique can work for any speaker system operating from the improved method.

However, if parts of the speaker are designed to require the dynamic compensation, additional performance features are possible. An adjustment list or bit map intended for the specialized system can have the same parameters and adjustments as the general-purpose system, i.e., the controls have features in common. Thus an electronic system with a compensation system is capable of receiving instructions to compensate and optimize a variety of speaker models and products which can be attached to it, both generic speakers and those designed specifically for use with the compensation system. When needed, the system can improve clarity, imaging, and bass extension without changing sonic balance, i.e., the sonic signature of a product-line is maintained.

The adjustment effect that parameters create are described or represented by a symbol or acronym as included in the previously described table. In this way, mathematical statements, circuits, loudspeaker design features and other specialized language are consolidated to lists that a programmer or user can intuitively interpret. Then, response-curves, behavioral features, wavelength relationships, as well as other things important to human perception, become relevant to the process model used for design and/or compensation of a loudspeaker system. Compensation is simplified since interactions between design and performance changes and basic relationships are meaningful and intuitive.

Settling and nodal compensation parameter adjustments include frequency in Hz, Q as a number, and rejection in dB. Since multiple-order nodal behaviors are possible, the Q and rejection adjustments are more likely to have similar values for more than one compensation frequency. Controls can be linked so that two or more frequencies in Hz can specify corrections for nodal behaviors sharing a mechanical or interference property in common.

Bell-mode compensation for speaker cones provides a good example. Several methods can determine these frequencies. Multiple nodes or wave-related interference can be observed using sine wave excitation and optical interferometry. Waterfall plots from MLSSA-type stimulus, as shown in FIG. 7, or a differential microphone probe can be interpreted to reveal settling energy from breakup. These behaviors are audible and the hidden compensation process can be manually or slowly swept in frequency to reveal sonic changes during pink-noise reproduction. The experimental method requires caution and experience since room reverberation can imitate the mechanical sounds. Correlation between the three techniques is good, and when several frequencies from similar causes are determined, composite weighted notches of similar Q and shared boost parameters simplify the correction.

The above parameters and their adjustments change a configured compensation for a specialized behavior of the loudspeaker. Some processes are inherently confined to a narrow range of frequencies where a particular kind of behavior is most likely to occur from the loudspeaker system. Others affecting time and response slopes cover a wide spectrum. These dedicated operations are isolated enough from each other that interaction between them is small. Selected parameters can be changed without affecting others. In addition, the data requirements are modest for useful adjustment resolution.

As described in the foregoing speaker example, controls adjusting the compensation system are related to physical parts and acoustic properties of the speaker. Other speakers of similar, but not exact design or construction can be improved in the same manner. The control or specification information to do so has the same simple, intuitive language. A small inexpensive speaker could be substantially improved with 16 parameter adjustments and a few default settings. To match the complex response from this system, a conventional multi-band or graphic equalizer would need well over 100 band, and much more control information.

The compensation system uses slopes, crossovers, and other mathematical functions to create predicted corrections for characteristics of the speaker. These operations are controlled by coefficients or points, and by process commands instead of from documenting and calculating responses to linear plots. Since each process has a specialized nature, the range of frequencies, amplitudes, Qs, etc., confine parameter ranges to small portions of a control space. A three-word code can create an accurately placed resonator or complex weighted response notch subsystem. In the case of 8-bit code words, this map or information sequence gives 128 points for a logarithmic frequency decade, +/−20 dB in ½ dB steps for amplitude, and 16 Q settings, as well as space for process commands and control formatting. For this example, 384 points or frequencies in the audio band would be available for setting sharp rejection notches and weighted compensations. Bitmaps for other parametric controls and process commands may require less resolution, thus providing even greater economy. This compact specification feature could be used for bar-code installation of the compensation system to correct a specific speaker design or for dynamic control of processes from codes hidden in data streams such as used in HDCD systems. As described in detail below, portable devices, such as hearing aids and communication systems benefit when the scope of processed information is reduced.

For many applications, 384 points or frequencies in the audio band might be chosen for a successful process incorporating ten basic operations, i.e., shelves, notches, compensations, cutoff filters, delays, etc. Process scale increases very rapidly with resolution: rejection notches can be sharp and need accurate tuning, interference compensations are inherently complex and speaker responses from a traditional measurement practice reveal little useful information to simplify processing. Unless the compensation system is designed to recognize and process sub-system or modeled responses from curves, the corrections must be done on a point-by-point basis. Even a good response correction done this way requires substantial process power. The scope of conventional processing widens when time, phase, and settling issues are considered. For this situation the number of filters or processes needed to resolve a useful correction response anywhere in a three-dimensional grid (such as a waterfall plot) can be impractical. Some economy is possible when filters or processing power are allocated to those portions of the grid requiring higher resolution and more correction activity. Even these efforts fail to achieve the hidden or compensated correction benefits of the compensation system.

A good example of this difficulty is evident from FIG. 6. The compensation system has 8 notches, one weighted notch for node correction, and a low frequency boost crossover and shelf. The high frequency drop provides a crossover to a tweeter. Clearly, the difficulty of plotting points and creating a response synthesis is evident. The compensation system creates this conjugate curve from 24 adjustments ($L_X$, $L_S$, $L_P$, $W_0$, $Q_0$, $|A|_0$, $W_1$ through $W_7$, $|A|_1$ through $|A|_7$, $W_{CC1}$, and one default Q setting).

A strategy similar to compensating the removal of in-band signals can be used for the highest and lowest frequencies. For example, distortion caused by excess cone motion from bass energy can be less objectionable by reducing the input to the speaker. One way to do this is to restrict the low frequency response to a practical value. Quite likely, the speaker would have been able to make feeble bass reproduction below the cutoff, provided the program material does not mask the low bass signals. Wide dynamic range program material can force the speaker to produce perceivable output at these frequencies. Unfortunately, the resulting feeble output is frequently covered up by other sounds in the same perceptual band of human hearing. Hence, most of the time an extended response from the speaker is useless and only adds distortion and consumes amplifier power.

The weighted response correction of the compensation system can be applied to the audible side of either a low or a high frequency broadband or cutoff rejection or filter. If done carefully, the perceptual response appears unaltered and can be made to sound extended as it was before filtering. Large systems intended to reproduce high-power, sub-audible or infrasonic energy require a different approach, although the same method applies.

The compensation system combines a loudspeaker model and conjugate process to create a zero-phase filter whose acoustic output has low group delay distortion. For this application, the peaked response not only complies with the standard practice but is used in the alignment to help improve group delay and becomes part of a hidden compensation that allows the band limiting feature to be turned on or off.

When neutrality like that described above is chosen, the compensation system can be made to change its cutoff depth and compensating energy with minimum audibility. This feature allows the compensation system to track or modulate from changes of volume control settings, power levels, or program conditions competing for perceptual bands. In this manner, the bandwidth restriction can force more power to the speaker before distortion sets in. Since audible energy is now rationed a smaller amplifier can produce the same playback volume.

These factors have economic importance. Speakers can have parts designed so that the system can benefit from the compensation system. They would have shorter voice coils and lighter-weight cones to produce higher acoustic output from an amplifier. Efficiency is higher, but mechanical behavior is often compromised and the acoustic output from such a design tends to rise with frequency. Without correction the speaker sounds harsh and shrill and therefore must be compensated. However, once these changes are corrected by the compensation system, the speaker plays louder, can be smaller, and a lower-powered amplifier can be used.

If virtual bass extension is chosen, the peaked or compensated response is moved in frequency with a carefully worked out strategy. Process settings and the related acoustic peaking frequency at a band edge becomes dependant on bass content of the program material, power reserve of the amplifier, and motion capability of the speaker. When playback level is high, and low frequency energy is strong, the peaking response is moved up in frequency to maintain a reasonable cone motion and distortion performance.

Most entertainment systems have equalizers, tone controls, and other user-operated or initiated features. Acoustic visibility is needed. The compensation system works best in tandem with these and can improve their performance. Once the speaker system has the more idealized radiation behavior provided by the compensation system, various response leveling systems will not have to sort out or guess which parts of a measured response taken from a microphone originate from the speaker or from the room. The compensation system can more effectively rule out inappropriate equalizations from these response leveling programs which might destroy phase response or be inappropriate for other listener positions. Tandem operation also assures removal of distracting mechanical sounds caused by responses that are unidentifiable by traditional methods. Human binaural perception is good at perceiving, recognizing, and localizing these sounds. Once they are removed, the traditional equalization methods can boost high frequencies without added harshness, and low frequencies without box boom or muddy sounds characteristic of minimal construction.

For the compensation system, specialized analog functional block circuits can make simple practical systems. Response ranges for their adjustable parts can be predicted from the conjugate model so that parallel signal paths and multiple shared functions are possible. Much fewer active devices are needed in a signal path, thereby reducing costs and distortion. Some time-related correction is possible from all-pass filters but other delay operations are impractical.

Exemplary analog and DSP implementations of the compensation system in a loudspeaker context are provided in appendices B and C, respectively. Descriptions of other applications of the compensation system follow.

Communication System—Communication systems can be subjected unwanted narrow-band noise or tones at fixed or varying frequency. Quite often some time latency is available allowing a subsystem to identify and track such tones. When it is not practical or possible to create an out-of-phase signal to remove the disturbance the compensation system achieves an effective result. Frequently, it is possible to track the disturbance with the parametrically moveable weighted response notch. Unless an intelligence signal has the same frequency as the one being rejected, the correction will be effective yet not degrade or change the sound. Frequently, communication systems have transducers such as microphones, headphones, and speakers as part of the sound reproduction system. These elements could have undesirable responses that can be compensated individually, or collectively as a system. One or more processors can be placed anywhere in the signal chain. They can be controlled or programmed to compensate a multitude of component part mixes, such as transducers, signal paths, human hearing requirements, and the like. To set up such a system, control parameter information may be identified or accessed by hidden codes in the signal path. Auxiliary channels, as well as other means, can be used to convey this information. Since the compensation system uses this information efficiently to create very complex responses, the correction process can be installed in many systems. Examples include computer speakers, telephone systems for hearing impaired, and mobile communications. For these systems, the processors can be external or not part of the end user appliance. Hence, the compensation system can be programmed to a particular model of appliance and externally activated. Part, all, or none of the processor can reside with the appliance.

Hearing Aid—Many hearing difficulties arise from damage to hair cells within the auditory nerve. Frequently people suffer tinitus or head ringing, and have difficult understanding conversations in crowded noisy rooms. Sometimes a closely spaced group of cells corresponding to a narrow frequency band has had mechanical damage causing an excessive nerve response to high intensity stimulus. This action often sounds discordant and painful. It may cause disruption to a hearing feedback path to and from the brain, so as to initiate premature protection functions, thereby aggravating the unpleasant sensation. Since the stimulus causing the mechanical motion is in a range of frequencies easily defined by medical test routines, the parametric weighted notch filter can be easily tuned to the same frequencies to block sound transmission that excites these cells. If the additive weighting is set up properly for the individual the perceptual loss to other sounds is reduced. In a typical situation the notch must have a band reject characteristic which may have to become wider with sound pressure level. The compensating side energy tracks these changes to reduce the intelligibility loss to other sounds. A system designed to perform this correction can be more effective and its specialized processing might take up less battery power than general-purpose response contouring methods.

Watermark Identification—A recording can be made with known frequencies removed by a sharp notch. If the same recording needs to be identified later a system can be made to search for the known missing frequencies. One can expect flutter, noise, and unpredictable clock rates to shift dead bands and to create a multitude of difficulties. A recording may use music signals to define operating frequencies and timing of encoded security notches. Clock dependency is reduced and number keys are used to prevent someone from finding these frequencies and altering their purpose. During playback, key identified parts of the program initiate decoding parameters used for verification. Like the communication system previously described, the recorded notch should be silent or hidden as best as possible and it is likely to jump from one frequency to another. The parametrically controlled weighted compensation method is ideal for this application, and the combination of keyed frequency jumping and hiding provides for an effective security system.

Feedback Elimination from Sound Systems—Large sound reinforcement installations, phones, and other systems involving the simultaneous acquisition and reproduction of sound are subject to feedback. Usually, a microphone picks up some part of a reproduced acoustic signal and adds to the signal to cause oscillation. Sophisticated DSP parts of speaker phones can sort out room echoes and phase relationships of cross talk to clarify sound transmission and eliminate feedback. Frequency shifters randomize feedback phase to prevent a slow buildup of howl or high-Q loose-coupled oscillation. Sometimes, the latency from these methods interferes with stage performance or synchronization. Tunable weighted notches can be set to sensitive frequencies to eliminate oscillation without significant loss to sounds. Double or multiple-tuned versions have little interaction with each other, and the inherent dead band makes tuning out feedback much easier.

CD Player—A typical electronic system, operating in either the digital or analog domain (or both), might combine intentional user adjustments and the compensation system. Parts descriptions, mathematical models, measured data, and human preference information may be combined and incorporated into its design. Once parameters are defined and their coefficient values are determined an organized group of numbers can program an electrical or mathematical system to perform specific correction response for different shapes and sizes of loudspeakers. The parameter list, and even the individual correction modules, can be downloaded to a digital signal processor in a CD player or other device. This operation can be done at any time, so that it provides a programmable upgrade. It can be activated by bar code, remote control, downloaded from a computer, or installed to dedicated player/speaker combinations.

While several particular forms of the invention have been illustrated and described, it will be apparent that various modifications can be made without departing from the spirit and scope of the invention.

What is claimed is:

1. A sound compensation system for altering an electrical audio signal for input to a sonic reproduction device having associated behavioral characteristics, said system comprising a model of the sonic reproduction device having a plurality of filters that simulate behavioral characteristics of the sonic reproduction device, wherein:

each said filter has an associated response that is combinable to define an overall response for the model; and at least one said filter, which corresponds to an individual component of the sonic reproduction device, is replaceable with another filter in response to replacement of the individual component of the sonic reproduction device with another individual component, wherein the other filter simulates a behavioral characteristic of the other individual component.

2. The system of claim 1 wherein the individual component corresponds to an individual component of a speaker.

3. The system of claim 1 wherein the behavioral characteristics are defined by groups of individual components of the sonic reproduction device.

4. The system of claim 1 wherein one or more said filters correspond to an enclosure of the sonic reproduction device.

5. The system of claim 1 wherein the sonic reproduction device comprises a speaker and at least one of the plurality of filters comprises at least one associated adjustable parameter and the value of the parameter is calculated based on physical characteristics of the speaker.

6. The system of claim 1 wherein the physical characteristics of the speaker comprises at least one of cone and coil mass, air volume, mechanical compliance, radiating area, damping, moving mass and motor characteristics.

7. The system of claim 1 wherein the sonic reproduction device comprises a speaker and at least one of the plurality of filters comprises at least one associated adjustable parameter and the value of the parameter is derived from a standard speaker model.

8. The system of claim 1 wherein at least one of the plurality of filters has at least one associated adjustable parameter and the value of the parameter is determined experimentally using standard test measurements.

9. The system of claim 1 wherein the sonic reproduction device comprises a speaker and the one parameter that modules the at least one other parameter relates to the magnet structure and voice coil of the speaker.

* * * * *